United States Patent
Kowatari et al.

(10) Patent No.: US 7,676,777 B2
(45) Date of Patent: Mar. 9, 2010

(54) METHOD AND APPARATUS FOR SUPPORTING VERIFICATION, AND COMPUTER PRODUCT

(75) Inventors: Satoshi Kowatari, Kawasaki (JP); Yoshiro Nakamura, Kawasaki (JP); Takako Shindo, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 379 days.

(21) Appl. No.: 11/727,623

(22) Filed: Mar. 27, 2007

(65) Prior Publication Data

US 2007/0234249 A1     Oct. 4, 2007

(30) Foreign Application Priority Data

Mar. 28, 2006     (JP)     ............................. 2006-088794

(51) Int. Cl.
  *G06F 17/50*     (2006.01)
  *G06F 19/00*     (2006.01)
(52) U.S. Cl. ............................................. 716/5; 703/16
(58) Field of Classification Search ...................... 716/5; 703/16
  See application file for complete search history.

(56) References Cited

U.S. PATENT DOCUMENTS 5,991,533 A * 11/1999 Sano et al. .................... 703/28

FOREIGN PATENT DOCUMENTS

| JP | 2000-181939 | 6/2000 |
| JP | 2003-030270 | 1/2003 |
| JP | 2004-326650 | 11/2004 |
| JP | 2005-196681 | 7/2005 |

OTHER PUBLICATIONS

Japanese Notification for Japanese Application No. 2006-088794 dated Apr. 28, 2009.

* cited by examiner

*Primary Examiner*—Phallaka Kik
(74) *Attorney, Agent, or Firm*—Staas & Halsey LLP

(57) ABSTRACT

A verification support apparatus receives description data. Upon receiving the description data, the apparatus automatically generates and outputs a verification property, a verification scenario, specification data, review information, etc. In addition, the apparatus checks the description data for any element of deficiency or inconsistency before the automatic generation of the verification property. Therefore, the amount of description data can be reduced by sorting out the types of verification items and listing parameters, and various verification properties can be automatically generated by allowing a computer to read verification data. Furthermore, a design TAT can be reduced by generating the specification data. Furthermore, even a designer not familiar with a verification language such as PSL can easily execute assertion-based verification.

23 Claims, 30 Drawing Sheets

FIG.4

| REGISTER INFORMATION | | RESULT DEFINING INFORMATION | | VALUE INFORMATION | | | CAUSE DEFINING INFORMATION | TEMPLATE INFORMATION | | | | | |
|---|---|---|---|---|---|---|---|---|---|---|---|---|---|
| | | FIELD INFORMATION | | | | | | | | | | | |
| AD-DRESS | REGIS-TER NAME | RANGE | FIELD NAME | REWRIT-ING VALUE | DESCRIP-TION | INITIAL VALUE | PRI-ORI-TY LEV-EL | REWRIT-ING CONDI-TION | TEM-PLATE TYPE | 1-1 | | 1-2 | |
| | | | | | | | | | | A | N | A | N |
| 0x000h | IntSts | 0 | IntReady0i | 0 | INTERRUP-TION PERMITTED BY POSSIBLE WRITING IN BUFFER DOES NOT OCCUR | 0 | 1 | IF C_RESET=1 RESULT, REWRITING IS MADE AT NEXT CYCLE | 1-1 | C_RESET | 1 | | |
| | | | | 1 | INTERRUP-TION PERMITTED BY POSSIBLE WRITING IN BUFFER OCCUR | | 2 | IF Init0i IS RELEASED, REWRITING IS MADE AT NEXT CYCLE | 1-2 | | | Init0i | |
| | | 1 | IntEmpty | | ... | | | ... | | | | | ... |

111

| [PSL TYPE] | CONTENTS OF TEMPLATE | TEMPLATE DESCRIPTION |
|---|---|---|
| 1-1 | IF IT IS A, B RESULT AFTER N CYCLE | always({ A } \|-> { true[*N]; B } abort R ) @(posedge C ) |
| 1-2 | ... | ... |
| ... | ... | ... |

FIG.11

VERIFICATION PROPERTY P1: IF C_RESET=1 RESULT, REWRITING IS MADE INTO 0 AT NEXT CYCLE(Prio:1)
VERIFICATION PROPERTY P2: If Init0i BIT IS RELEASED, REWRITING IS MADE INTO 1(Prio:3)

REWRITING CONDITION :   endpoint CN1 = { ~C_RESET; C_RESET };

REWRITING CONDITION :   endpoint CN2 = { Init0i; ~Init0i };

VERIFICATION PROPERTY Q1 :   property CN1_check = always({ {~C_RESET;C_RESET}
                                                          |→{true[*1]; (IntReady0i==1'b0)} });

VERIFICATION PROPERTY Q2 :   property CN2_check = always({ {Init0i; ~Init0i}
                                                          |→{true[*1:inf]; (IntReady0i==1'b1) }abort CN1 );

FIG. 16

REGISTER MAP — 1501

| ADDRESS | REGISTER NAME |
|---|---|
| 0 x 000h | IntSts |
| 0 x 004h | ... |

REGISTER FIELD MAP — 1502

| BIT NUMBER | 31 | 30 | 29 | 28 | 27 | 26 | 25 | 24 |
|---|---|---|---|---|---|---|---|---|
| FIELD NAME | Reserve [31:24] | | | | | | | |
| INITIAL VALUE | 0 | 0 | 0 | 0 | 0 | 0 | 0 | 0 |
| BIT NUMBER | 23 | 22 | 21 | 20 | 19 | 18 | 17 | 20 |
| FIELD NAME | Reserve [23:20] | | | | | | | |
| INITIAL VALUE | 0 | 0 | 0 | 0 | 0 | 0 | 0 | 0 |
| BIT NUMBER | 15 | 14 | 13 | 12 | 11 | 10 | 9 | 8 |
| FIELD NAME | Reserve [15:8] | | | | | | | |
| INITIAL VALUE | 0 | 0 | 0 | 0 | 0 | 0 | 0 | 0 |
| BIT NUMBER | 7 | 6 | 5 | 4 | 3 | 2 | 1 | 0 |
| FIELD NAME | Reserve[7:2] | | | | | | IntEmpty | IntRdy0i |
| INITIAL VALUE | 0 | 0 | 0 | 0 | 0 | 0 | 0 | 0 |

⋮

· IntRdy0i[0]

| VALUE | MEANING (DESCRIPTION OF BIT) |
|---|---|
| 0h | INTERRUPTION PERMITTED BY POSSIBLE WRITING IN BUFFER DOES NOT OCCUR |
| 1h | INTERRUPTION PERMITTED BY POSSIBLE WRITING IN BUFFER OCCUR |

· IntEmpty[1]

⋮  — 1503

· IntRdy0i[0]

| VALUE | MEANING (DESCRIPTION OF CONVERSION) |
|---|---|
| set | REWRITING IS MADE AT NEXT CYCLE ONWARD AFTER Init$\phi$i HAS BEEN RELEASED |
| reset(1'b0) | REWRITING IS MADE AT NEXT CYCLE ONWARD AFTER C_RESET=1 HAS RESULTED |

METHOD AND APPARATUS FOR SUPPORTING VERIFICATION, AND COMPUTER PRODUCT

CROSS-REFERENCE TO RELATED APPLICATIONS

This application is based upon and claims the benefit of priority from the prior Japanese Patent Application No. 2006-088794, filed on Mar. 28, 2006, the entire contents of which are incorporated herein by reference.

BACKGROUND OF THE INVENTION

1. Field of the Invention

The present invention relates to a technology for supporting logic verification of a large scale integration (LSI).

2. Description of the Related Art

Logic verification to check if an LSI operates normally is imperative in designing the LSI. There is a growing demand for an LSI of greater scale, higher performance, higher speed, and less power consumption, and for such LSI, the logic verification is especially important to maintain the quality. Meanwhile, there also is an increasing demand for improving the efficiency of the verification by shortening a verification period.

FIG. 1 is a schematic of a conventional verification system. According to the verification system 3700, review information 3703 and a verification property 3704 are produced from a specification 3701 of a target circuit, which is made by a designer, thorough a manual conversion process 3702 executed by the designer. The review information 3703 is fed back to the specification 3701 to review the specification 3701.

The verification property 3704 obtained through the conversion process, a verification scenario 3705, and circuit information 3706 of the target circuit, are input into a verification apparatus 3710 to perform logic verification of the target circuit. Conventional techniques related to such a verification system have been disclosed in: Japanese Patent Application Laid-Open Publication No. 2000-181939; Japanese Patent Application Laid-Open Publication No. 2003-30270; and Japanese Patent Application Laid-Open Publication No. 2005-196681.

However, in performing logic verification of a state saving module such as a register in a logic circuit, it is necessary to produce a great number of verification properties which are used to monitor each register rewriting condition read out of a specification and to report an error if any. The verification properties have orders of priority, and producing the verification properties in consideration of the priority order without an error is extremely difficult.

SUMMARY OF THE INVENTION

It is an object of the present invention to at least solve the above problems in the conventional technologies.

A verification support apparatus according to an aspect of the present invention includes a receiving unit, a first extracting unit, and a generating unit. The receiving unit receives description data including a description of a change in a state of a register included in a circuit and template specifying information. The description includes a description of a cause and a description of a result of the change. The first extracting unit extracts, from a group of templates, a template specified by the template specifying information. The generating unit generates a verification property representing the change, based on the template and the description of the change.

A verification support method according to another aspect of the present invention includes receiving, extracting, and generating. At the receiving, description data including a description of a change in a state of a register included in a circuit and template specifying information is received. The description includes a description of a cause and a description of a result of the change. At the extracting, a template specified by the template specifying information is extracted from a group of templates. At the generating, a verification property representing the change is generated based on the template and the description of the change.

A computer-readable recording medium according to still another aspect of the present invention stores therein a verification support program that causes a computer to execute the method according to the above aspect.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 4 is a schematic of description data;

FIG. 11 is a schematic for illustrating automatic generation of verification properties according to the second embodiment;

FIG. 16 is schematic of a generated specification data;

DETAILED DESCRIPTION OF THE PREFERRED EMBODIMENTS

Exemplary embodiments of the present invention will be described in detail with reference to the accompanying drawings. The contents of the description of an embodiment apply in common to the first to ninth embodiments described subsequently.

Figure 1:
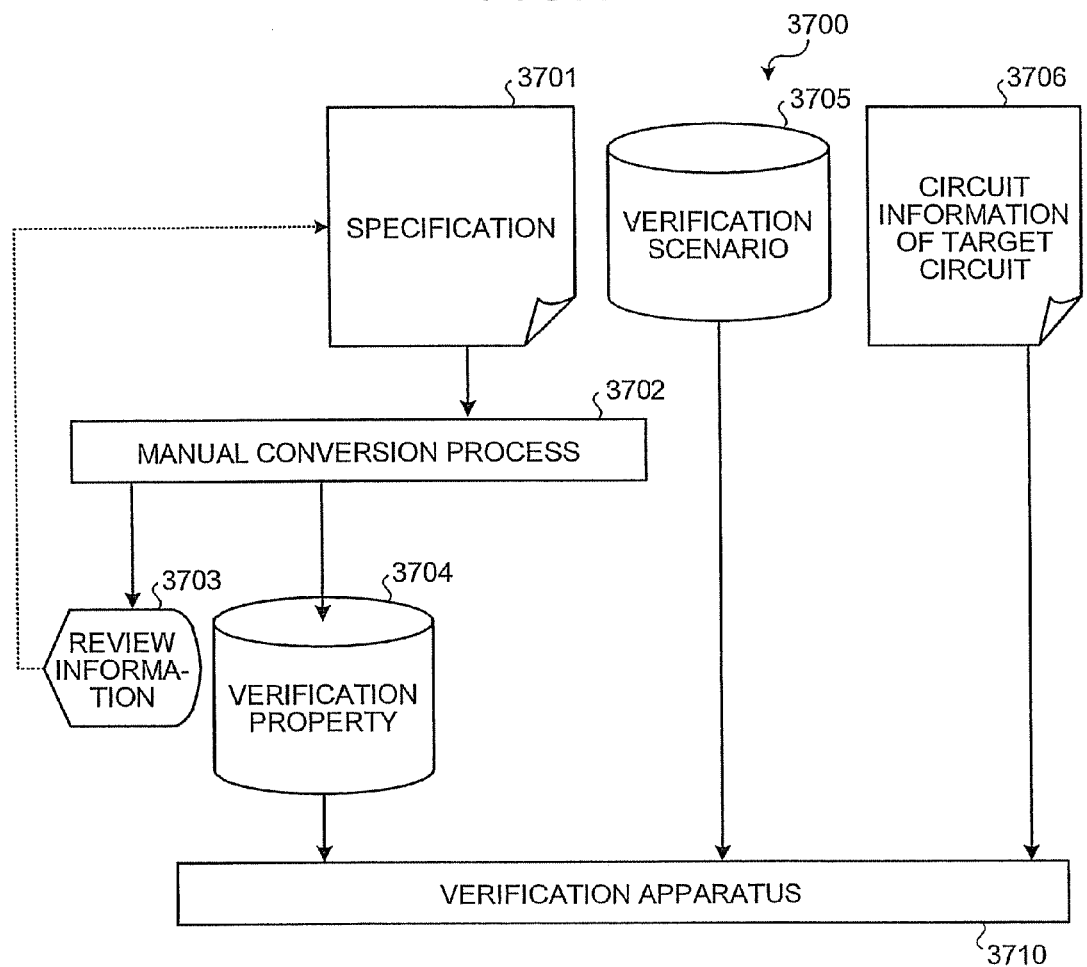
FIG. 1 is an explanatory diagram of a conventional verification system.
Figure 2:
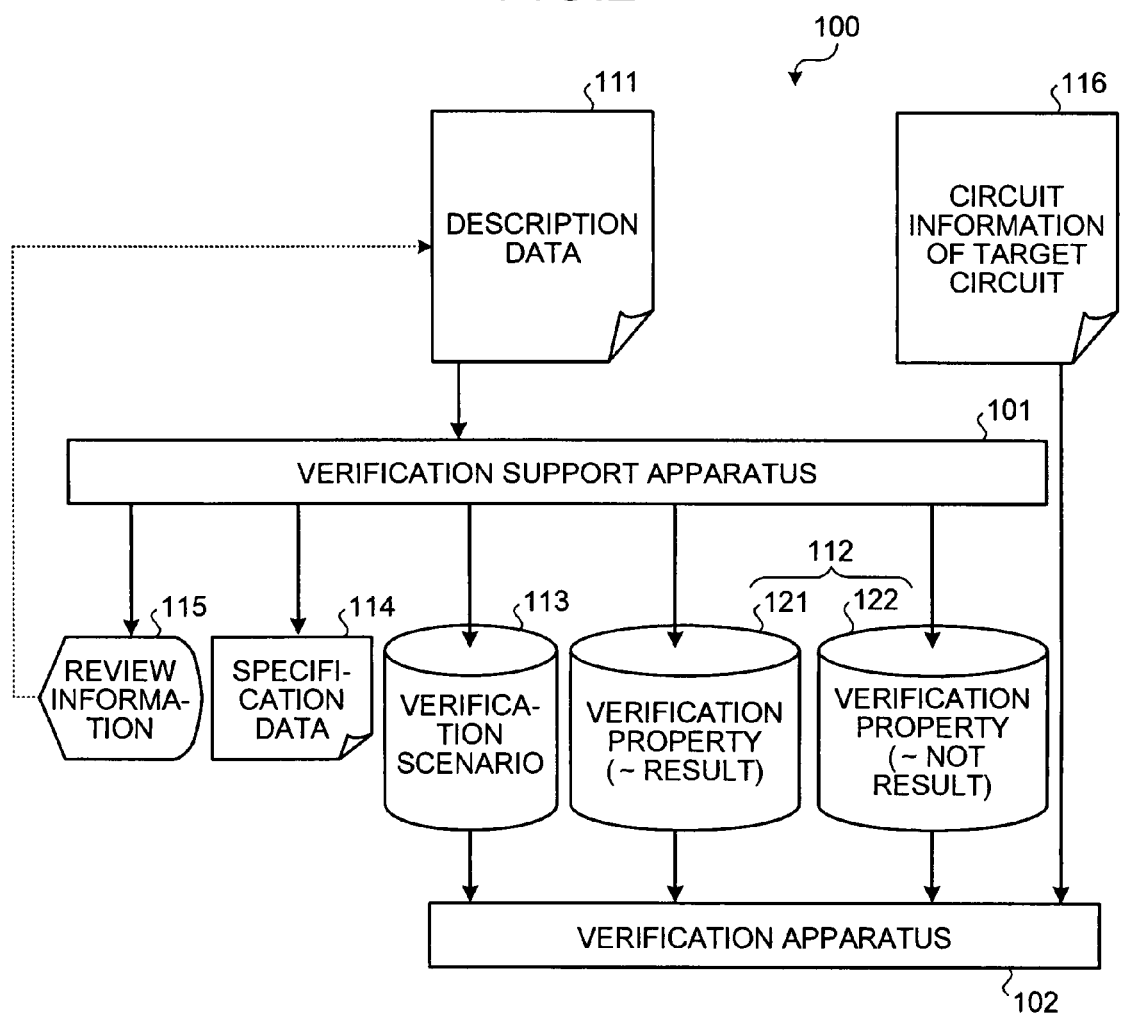
FIG. 2 is a block diagram of a verification system according to an embodiment of the present invention.

A verification system is a system that performs logic verification of a target circuit. FIG. 2 is a block diagram of a verification system according to an embodiment of the present invention.

A verification system 100 includes a verification support apparatus 101 and a verification apparatus 102. The verification support apparatus 101 is a computer that receives input of description data 111 and generates to output a verification property 112, a verification scenario 113, specification data 114, and review information 115. The description data 111 will be described later referring to FIG. 4.

The verification property 112 means such description data that includes a cause indicating an operational condition for a register in a logic circuit included in a target circuit, and a result indicating the content of operation (change in a state) of the register when the operational condition is satisfied.

For example, the verification property 112 includes a verification property 121 indicating "when a register is rewritten from '0' to '1', a result occurs after two cycles", and a verification property 122 indicating "if a result occurs, the register must have been rewritten from '0' to '1' two cycles before". The verification property 112 is, for example, written in a computer-readable language such as verification property language including property specification language (PSL).

The verification scenario 113 means such description data that indicates a flow of a function (scenario) of the target circuit when the function is verified. For example, when a function of a processor in a CPU is verified, the verification scenario 113 is provided as pattern data that is put into the processor to check whether an operation of "A+B=C results" is executed.

The verification apparatus 102 is a computer that takes in circuit information 116 of the target circuit (for example, a hardware description language (HDL) description and a net list), the verification property 112, and the verification scenario 113 from the verification support apparatus 101, and checks whether the target circuit operates in accordance with the verification property 112 or the verification scenario 113.

Figure 3:
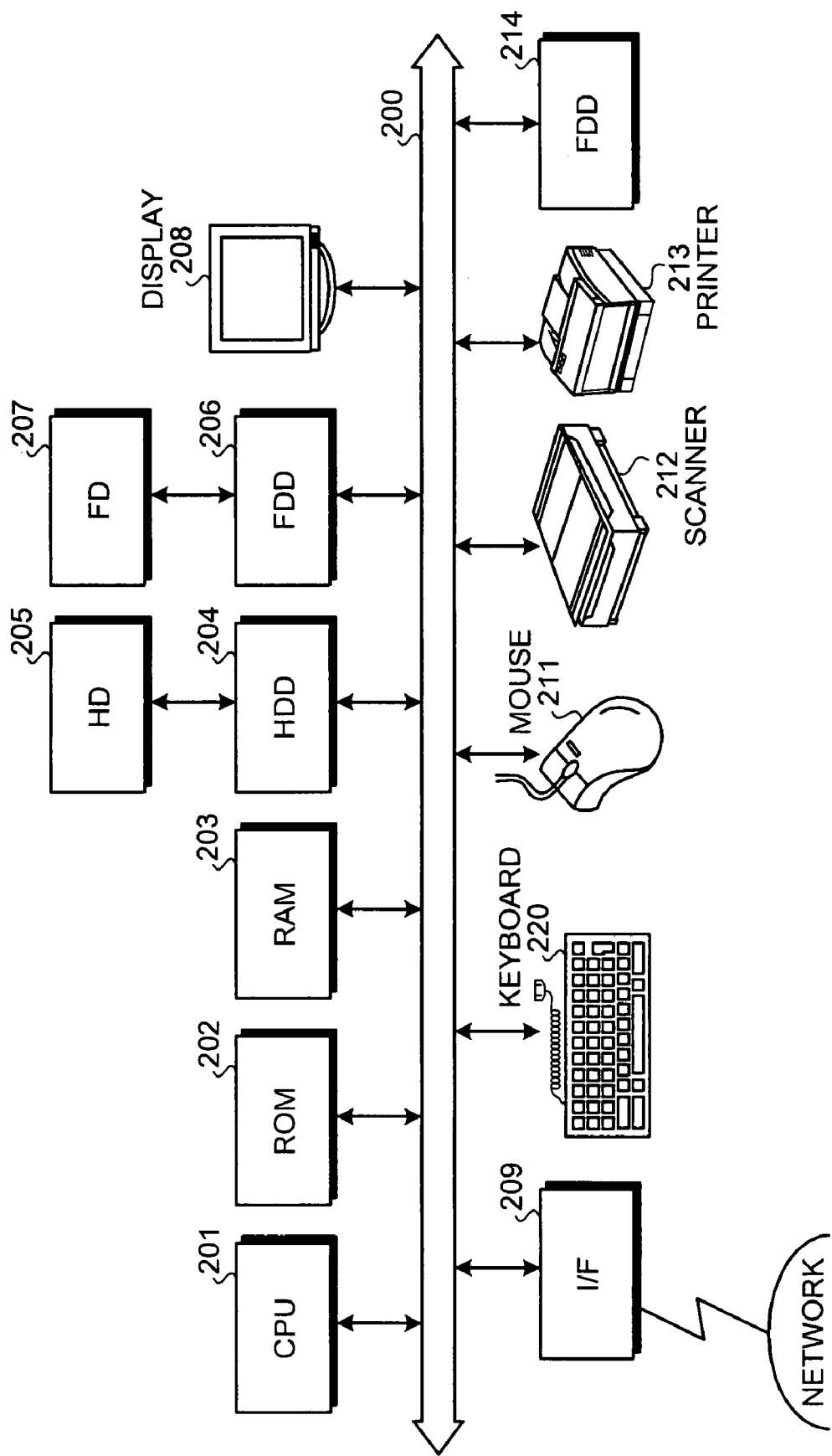
FIG. 3 is a schematic of a computer shown in FIG. 2.

FIG. 3 is a schematic of the computer shown in FIG. 2. The computer includes a central processing unit (CPU) 201, a read only memory (ROM) 202, a random access memory (RAM) 203, a hard disc drive (HDD) 204, a hard disk (HD) 205, a flexible disc drive (FDD) 206, a flexible disk (FD) 207 as an instance of a removable recording medium, a display 208, an interface (I/F) 209, a keyboard 210, a mouse 211, a scanner 212, and a printer 213. Each component is connected via a bus 200.

The CPU 201 controls the entire computer. The ROM 202 stores a program such as a boot program. The ROM 203 is used as a work area of the CPU 201. The HDD 204 controls reading/writing of data from/to the HD 205 under the control of the CPU 201. The HDD 204 stores data that is written into the HDD 204 under the control of the HDD 204.

The FDD 206 controls reading/writing of data from/to the FD 207 under the control of the CPU 201. The FD 207 stores data that is written into the FD 207 under the control of the FDD 206, or allows the verification support apparatus 101 to read the data stored in the FD 207.

Besides the FD 207, the removable recording medium may be a compact-disc read-only memory (CD-ROM), a compact-disc recordable (CD-R), a compact-disc rewritable (CD-RW), a magneto optical disk (MO), a digital versatile disc (DVD), a memory card, etc. The display 208 displays a cursor, icons, a tool box, document data, image data, functional information, etc. For example, a cathode-ray tube (CRT), a thin-film transistor (TFT) liquid crystal display, or a plasma display can be employed as the display 208.

The I/F 209 is connected to a network such as the Internet via a communication line, and is connected to other devices via the network. The I/F 209 is an interface between the network and the computer, and controls input/output of data from/to the external devices. For example, a modem or a local area network (LAN) adaptor can be employed as the I/F 209.

The keyboard 210 includes plural keys to input characters, figures, various instructions, etc. The keyboard 210 may be an input pad having a touch panel, a numeric key pad, etc. The mouse 211 is used to move the cursor, select key range, move a window or change the size of a window, etc. The mouse 311 may be a track ball or a joy stick that includes a similar function as a pointing device.

The scanner 212 optically reads an image to capture image data into the computer. The scanner 212 may be provided with an optical character reader (OCR) function. The printer 213 may be a laser printer or an ink jet printer.

FIG. 4 is a schematic of description data 111. Description data 111 is electronic data that includes result defining information and cause defining information.

The result defining information means the information that defines a result of a change in the state of a register. The result defining information includes register information, field information, and value information. The register information is a piece of information specifying the physical position of the register, and includes an address and a name of the register. The field information includes a range indicating a position of a field, and a name of the field. The value information is the information that specifies a value a field can have. The value information includes a rewriting value, a description indicating a means when the field has the rewriting value, and an initial value indicating whether the rewriting value is an initial value.

The cause defining information means the information that defines a cause of a change in the state of a register. The cause defining information includes a priority level, a rewriting condition, and template information. The priority level means the order of priority of the rewriting condition. Specifically, as shown in FIG. 4, a condition indicating a value of a field name "IntReady0i" is rewritten into a specified value "0" is given a priority level of "1". The rewriting condition means a description on a condition to turn a value of the field into the rewriting value. For example, the description is such text data as "If C_RESET=1 results, rewriting is made at the next cycle". The text data is displayed for review. The template information is a data segment that formally defines the rewriting condition. The template information is defined using a template and a parameter value in a template DB shown in FIG. 5. The template information, specifically, is a description of a template type that specifies the type of a template, and of the definition of parameters for the template type. Referring to FIG. 4, "1-1" is described as a template type, and a parameter A for "1-1" is defined as "C_RESET", and a parameter N for "1-1" is defined as "1".

Figure 5:
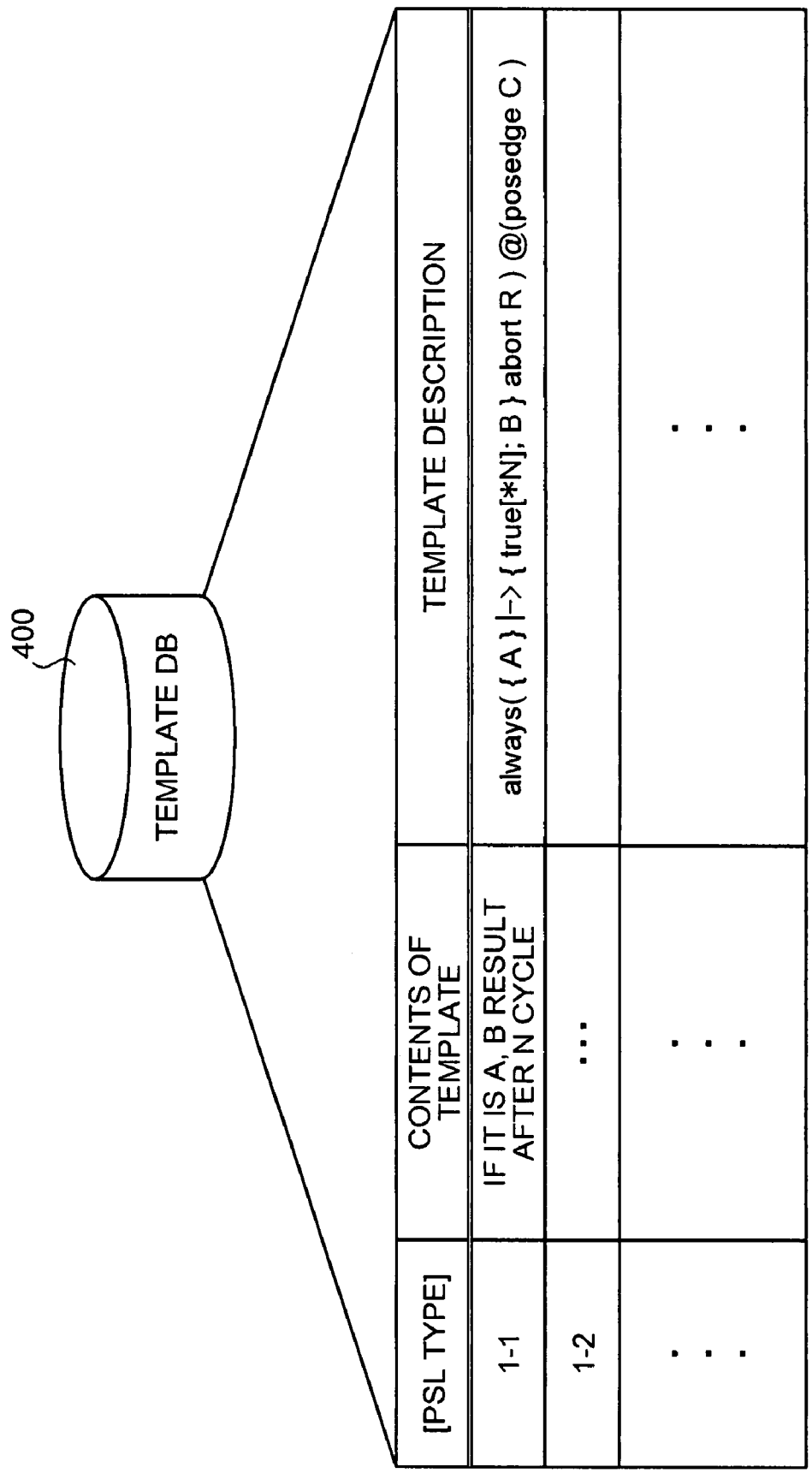
FIG. 5 is a schematic of the memory contents of a template DB.

FIG. 5 is a schematic of a template DB. A template DB 400 records contents of a template and a template description for each template type. The contents of a template is information indicating the meaning of the template description (for example, text data), which is written in a verification property language. The template description is information that is description data on causes/results abstracted using parameters.

A first embodiment is an embodiment according to which a verification support apparatus automatically generates a verification property 112 for checking an operation of "If register rewriting condition is satisfied, a register value changes into a specified value".

Figure 6:
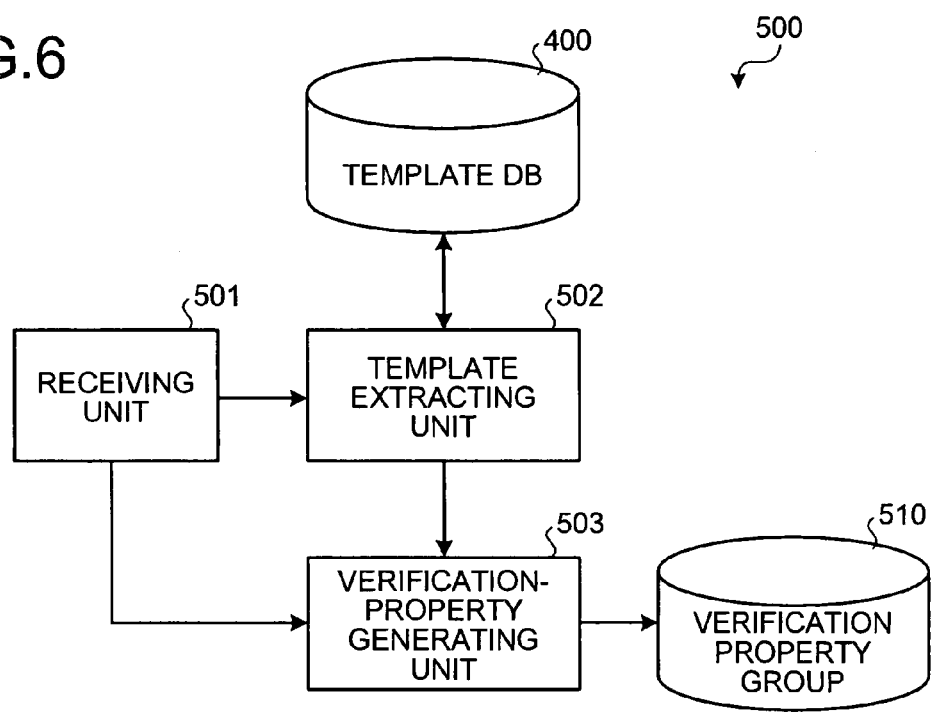
FIG. 6 is a block diagram of functional configuration of a verification support apparatus according to a first embodiment.

FIG. 6 is a block diagram of functional configuration of the verification support apparatus according to the first embodiment. A verification support apparatus 500 includes the template DB 400, a receiving unit 501, a template extracting unit 502, and a verification-property generating unit 503.

The receiving unit 501 receives input of the description data 111 shown in FIG. 4. The template extracting unit 502 extracts, based on a template type included in the description data 111, a template description of which a template type is identical to the template type in the description data 111 from the template DB 400.

The verification-property generating unit 503 automatically generates a verification property 112 by giving the contents of the description data 111 to the template description extracted by the template extracting unit 502. A group of generated verification properties 112 are stored as a verification property group 510 in a memory (for example, the RAM 203 and the HD 205 shown in FIG. 3).

The receiving unit 501, the template extracting unit 502, and the verification-property generating unit 503 are realized by the CPU 201 that executes a program stored in recording media such as the ROM 202, the RAM 203, and the HD 205 shown in FIG. 3, or by the I/F 209.

Figure 7:
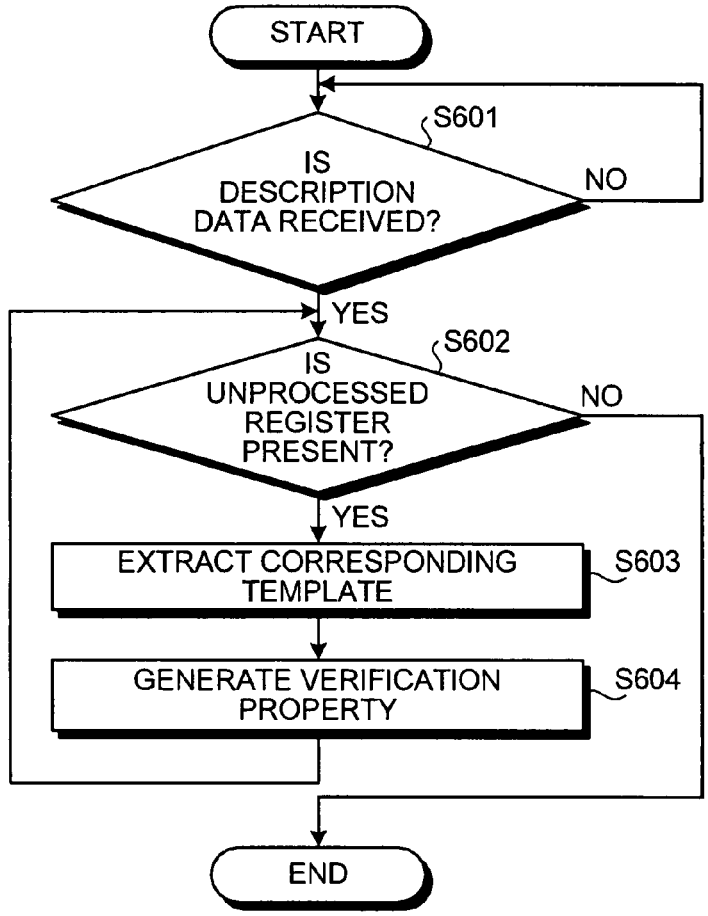
FIG. 7 is a flowchart of a verification support procedure performed by the verification support apparatus according to the first embodiment.

FIG. 7 is a flowchart of a verification support procedure performed by the verification support apparatus 500 according to the first embodiment. When the receiving unit 501 receives input of the description data 111 (step S601: YES), it is judged whether an unprocessed register is present (step S602). When an unprocessed register is present (step S602: YES), the template extracting unit 502 extracts a template description corresponding to description data 111 of the unprocessed register (step S603).

The verification-property generating unit 503 generates the verification property 112 by giving the description data 111 to the extracted template description (step S604), and the process returns to step S602. When it is judged at step S602 that an unprocessed register is not present (step S602: NO), a series of steps is finished. The generated verification property 112 is input into the verification apparatus 102 to execute logic verification of the target circuit.

Figure 8:
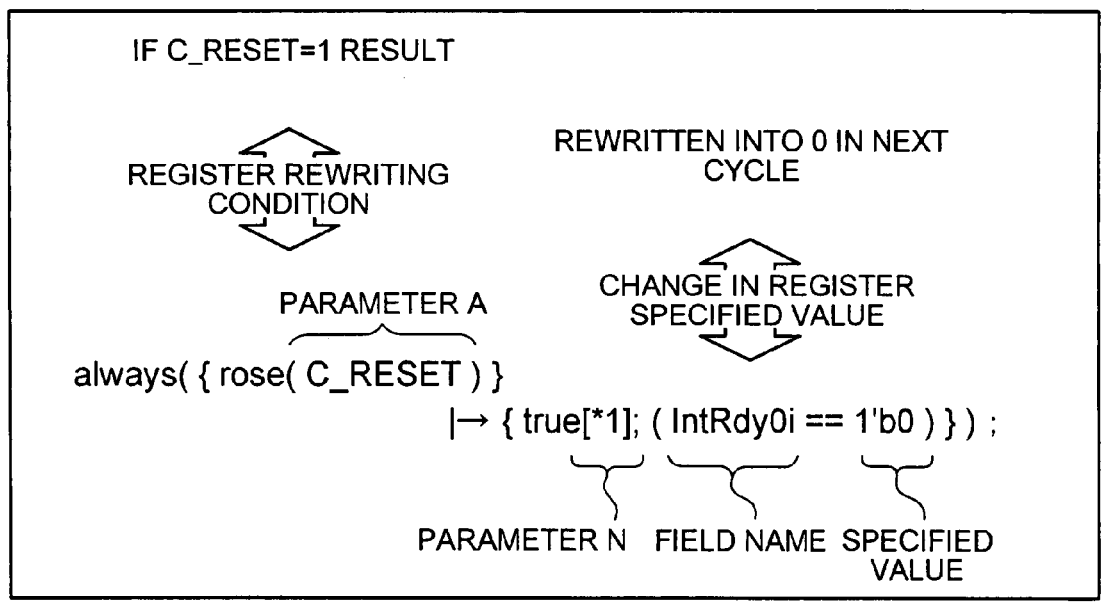
FIG. 8 is a schematic for illustrating automatic generation of a verification property.

FIG. 8 is a schematic for illustrating the automatic generation of the verification property 112. The following explanation will be made referring to the description data 111 shown in FIG. 4. When the description data 111 shown in FIG. 4 is input into the verification support apparatus, a template description is extracted from the template DB shown in FIG. 5 using a template type included in the description data 111.

The extracted template description is then provided with a parameter A in the description data 111 as a register rewriting condition, and with a parameter N, a field name "IntRdy0i", and a value 0 (1' b0), as a change of a register value into a specified value. Thus, the verification property 112 indicating "If C_RESET=1 results, IntRdy0i is rewritten into 0 at the next cycle" is generated.

According to the first embodiment, a designer can cause the verification support apparatus to easily and automatically generate the verification property 112 for checking the operation of "If register rewriting condition arises, a register value changes into a specified value" only by inputting the description data 111 into the apparatus. Therefore, efficiency of verification work by the designer and shortening a verification period can be achieved.

A second embodiment is an embodiment according to which a competition condition is added to the verification property according to the first embodiment. Competition means that results inconsistent with each other come out simultaneously between the verification properties 112. In such a case, values of priority level included in the description data 111 are checked, and are added to the verification properties 112. Thus, verification using a verification property 112 having a lower priority can be canceled. The same components as in the first embodiment are denoted by the same reference numerals used in the first embodiment, and explanation thereof is omitted.

Figure 9:
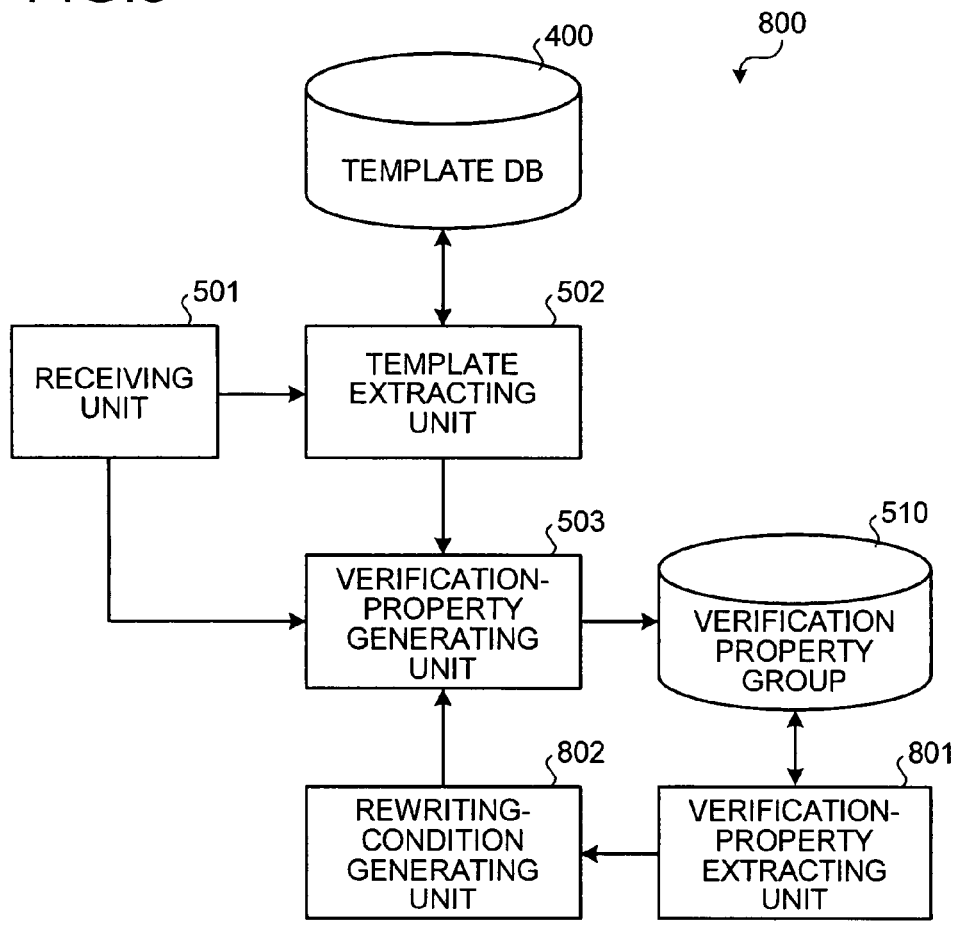
FIG. 9 is a block diagram of functional configuration of a verification support apparatus according to a second embodiment.

FIG. 9 is a block diagram of functional configuration of a verification support apparatus according to the second embodiment. A verification support apparatus 800 includes the receiving unit 501, the template extracting unit 502, the verification-property generating unit 503, a verification-property extracting unit 801, and a rewriting-condition generating unit 802.

The verification-property extracting unit 801 extracts verification properties 112 competing with each other from the verification property group 510. The rewriting-condition generating unit 802 generates description data (rewriting conditions) that indicate conditions under which rewriting of registers occur in the extracted verification properties 112 competing with each other.

The verification-property generating unit 503 adds, based on priority levels included in the description data 111 from which the competing verification properties are generated, a rewriting condition having high priority to a cancel condition for the verification properties 112. Specifically, for example, the rewriting condition of a verification property 112 having higher priority is added to an abort statement for a verification property 112 having lower priority, using an abort statement written in property specification language (PSL) that is one of verification property languages.

The verification-property extracting unit 801 and the rewriting-condition generating unit 802 are realized by the CPU 201 that executes programs stored in recording media such as the ROM 202, the RAM 203, and the HD 205 shown in FIG. 3, or by the I/F 209.

Figure 10:
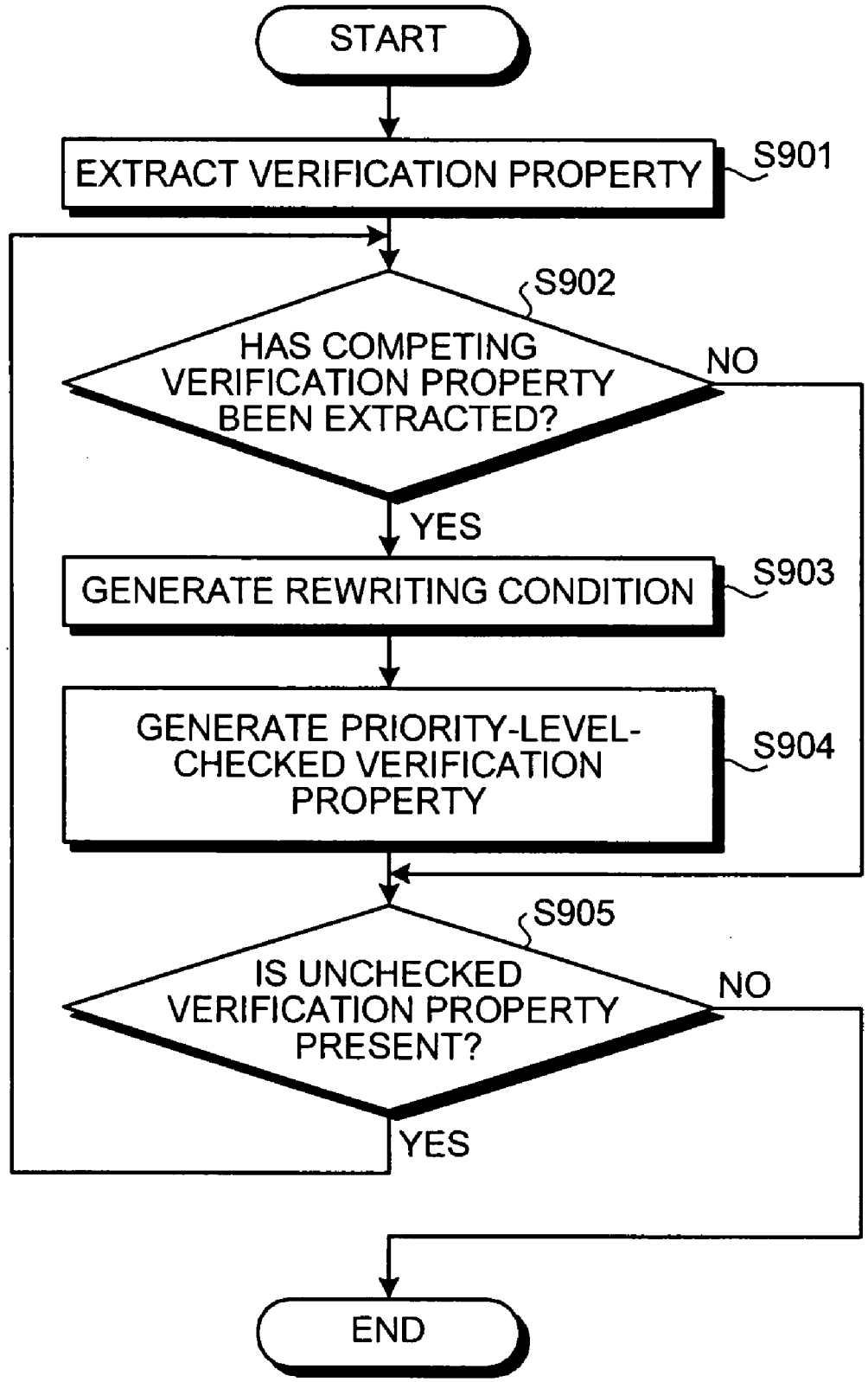
FIG. 10 is a flowchart of a verification support procedure performed by the verification support apparatus according to the second embodiment.

FIG. 10 is a flowchart of a verification support procedure performed by the verification support apparatus 800 according to the second embodiment. The verification-property extracting unit 801 extracts an arbitrary verification property 112 (step S901), and it is judged whether another verification property 112 competing with the extracted verification property 112 has been extracted (step S902). When it is judged that no competing verification property 112 has been extracted (step S902: NO), the process proceeds to step S905.

On the other hand, when it is judged that a competing verification property 112 has been extracted (step S902: YES), the rewriting-condition generating unit 802 generates a rewriting condition for each of the verification properties 112 competing with each other (step S903). The verification-property generating unit 503 generates priority-level-checked verification properties 112 based on the priority levels of the verification properties 112 competing with each other (step S904).

Then, it is judged whether a verification property 112 not checked for priority level is present (step S905). When it is judged that an unchecked verification property 112 is present (step S905: YES), the process returns to step S902. When it is judged that an unchecked verification property 112 is not present (step S905: NO), a series of steps is finished.

FIG. 11 is a schematic for illustrating automatic generation of the verification properties 112 according to the second embodiment. A verification property P1 indicates "If C_RESET=1 results, rewriting is made into 0 at the next cycle", and a verification property P2 indicates "If Init0i bit is released, rewriting is made into 1". While being written in the natural language for convenience here, the contents of the verification properties P1 and P2 are actually written in a verification property language.

The verification property P1 has a priority level of 1, while the verification property P2 has a priority level of 3. The verification property P1 and the verification property P2 are properties between which the results of rewriting of registers are inconsistent with each other.

When the verification-property extracting unit 801 extracts the mutually-competing verification properties P1 and P2, the rewriting-condition generating unit 802 generates a rewriting condition CN1 for the verification property P1, and a rewriting condition CN2 for the verification property P2.

In the verification property P1, "C_RESET=1" results on the condition of "C_RESET=0" at the previous cycle. Hence the rewriting condition CN1 is generated. In the verification property P2, a register value is "1" before the release of "Init0i bit", and is rewritten into "0" after the release.

Rewriting condition CN1: endpoint CN1={~C_RESET; C_RESET};

Rewriting condition CN2: endpoint CN2={Init0i; ~Init0i};

The verification-property generating unit 503 generates a priority-level-checked verification property Q1 by adding the rewriting condition CN1 to the verification property P1 having higher priority. On the other hand, the verification-property generating unit 503 generates a priority-level-checked verification property Q2 by adding the rewriting condition CN2 to the verification property P2 having lower priority, and also adding, to the verification property P2, a cancel statement including the rewriting condition CN1 in the from of an abort statement written in a verification property language.

As a result, when the rewriting condition CN1 is satisfied, logic verification using the priority-level-checked verification property Q2 is canceled to check. Thus, the priority-level-checked verification properties Q1 and Q2 do not compete with each other.

Therefore, a check by a verification property having lower priority is cancelled while a check by a verification property having higher priority continues even when a competition between verification properties occurs.

According to the second embodiment, a designer can cause the verification support apparatus to easily and automatically generate a verification property that cancels a check on a rewriting condition having lower priority when a rewriting condition having higher priority is satisfied, using a cancel statement written in a verification language (for example, an abort statement written in PSL), only by giving the description data 111 priority levels. Therefore, efficiency of verification work by the designer and shortening a verification period can be achieved.

A third embodiment is an embodiment according to which a verification property 112 of a reverse proposition is generated in the first embodiment. The reverse proposition means checking that when a register value changes (0 to 1 or 1 to 0), a rewriting condition is certainly satisfied before the change (or at the same time when the change occurs).

Figure 12:
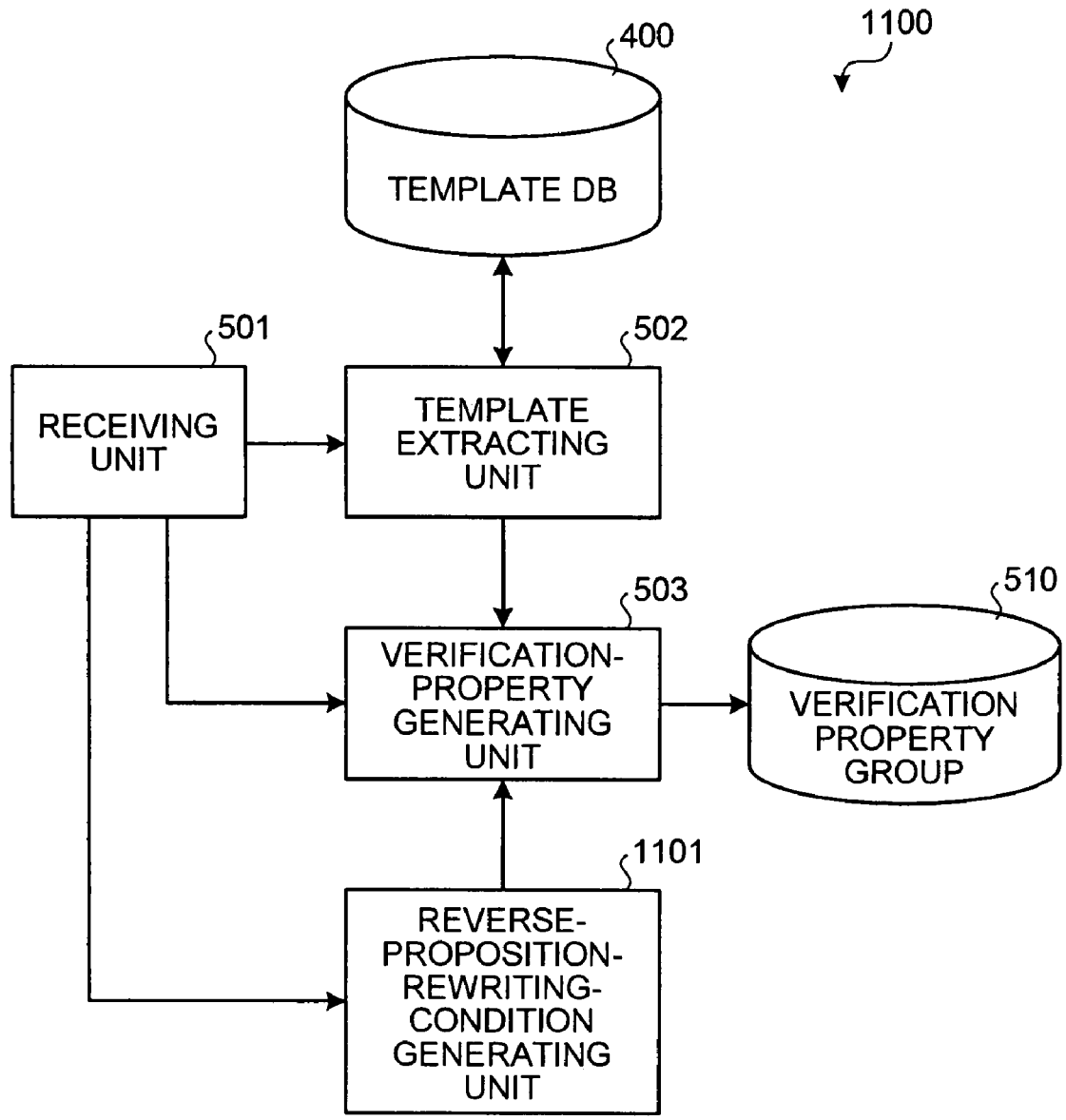
FIG. 12 is a block diagram of functional configuration of a verification support apparatus according to a third embodiment.

FIG. 12 is a block diagram of functional configuration of a verification support apparatus according to the third embodiment. A verification support apparatus 1100 includes the receiving unit 501, the template extracting unit 502, the verification-property generating unit 503, and a reverse proposition-rewriting-condition generating unit 1101.

The reverse-proposition-rewriting-condition generating unit 1101 extracts rewriting conditions from the description data 111 received by the receiving unit 501, and generates reverse-proposition rewriting conditions. Specifically, the reverse-proposition-rewriting-condition generating unit 1101 extracts one or plural rewriting conditions to cause certain rewriting results to occur. For example, for a rewriting result of "IntRdy0i is rewritten into 0 at the next cycle", the reverse-proposition-rewriting-condition generating unit 1101 extracts a rewriting condition (for example, "If C_RESET=1 results") to cause the result to occur. The reverse-proposition-rewriting-condition generating unit 1101 then generates a reverse-proposition rewriting condition by expressing a cancel statement created from each rewriting condition (using, for example, an abort statement written in PSL).

In this case, the verification-property generating unit 503 expresses, when a reverse-proposition rewriting condition is given, a reverse-proposition rewriting result using a negative statement written in a verification property language (for example, a never statement in PSL). The reverse-proposition rewriting condition and the reverse-proposition rewriting result are combined to generate a reverse-proposition verification property indicating "A rewriting result does not occur unless a rewriting condition is satisfied".

The reverse-proposition-rewriting-condition generating unit 1101 is realized by the CPU 201 that executes programs stored in recording media such as the ROM 202, the RAM 203, and the HD 205 shown in FIG. 3, or by the I/F 209.

Figures 13, 14:
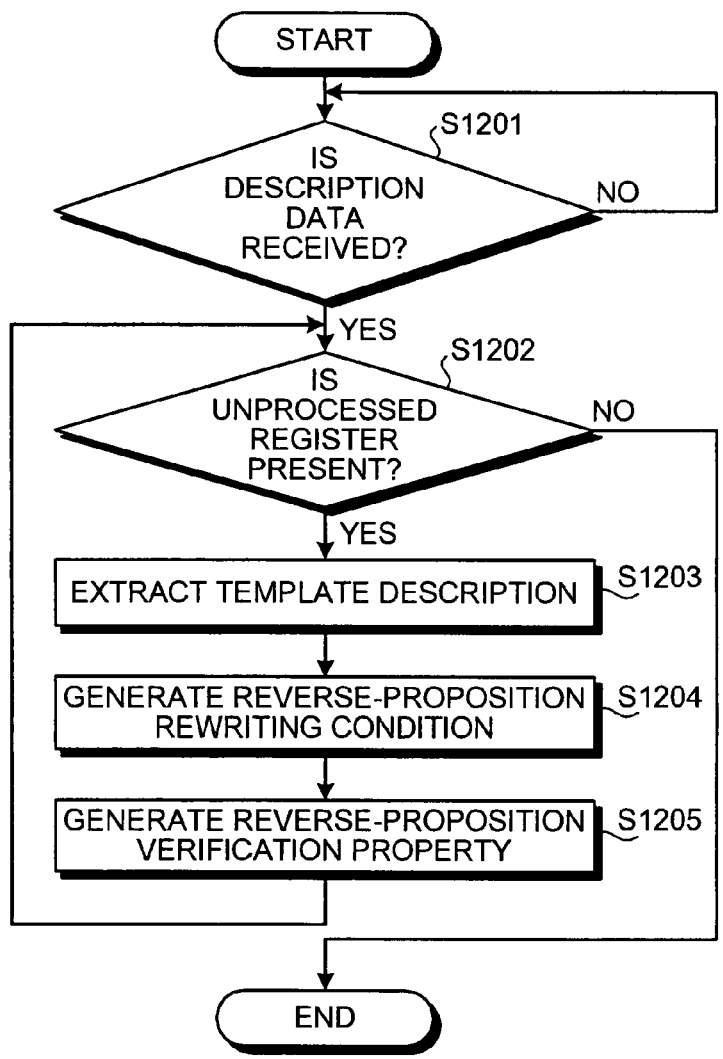
FIG. 13 is a flowchart of a verification support procedure performed by the verification support apparatus according to the third embodiment.
FIG. 14 is a schematic for illustrating automatic generation of a reverse-proposition verification property.

FIG. 13 is a flowchart of a verification support procedure performed by the verification support apparatus 1100 according to the third embodiment. When the description data 111 is received by the receiving unit 501 (step S1201: YES), it is judged whether an unprocessed register is present (step S1202). When an unprocessed register is present (step S1202: YES), the template extracting unit 502 extracts a template description corresponding to the description data 111 of the unprocessed register (step S1203).

The reverse-proposition-rewriting-condition generating unit 1101 extracts a rewriting condition from the description data 111, and generates a reverse-proposition rewriting condition (step S1204). The verification-property generating unit 503 generates a reverse-proposition verification property 112 (step S1205), and then the process returns to step S1202. When it is judged at step S1202 that an unprocessed register is not present (step S1202: NO), a series of steps is finished. The generated reverse proposition verification property 112 is input into the verification apparatus 102 to execute logic verification of the target circuit.

FIG. 14 is a schematic for illustrating automatic generation of the reverse-proposition verification property 112. The following description will be made referring to a result of "IntRdy0i in a register has been rewritten from 1 into 0".

When rewriting conditions for rewriting from 1 into 0 are CN1 to CN9, the result of "IntRdy0i in a register has been rewritten from 1 into 0" leads to a conclusion that at least any one of the rewriting conditions CN1 to CN9 must have been satisfied. In other words, "IntRdy0i in the register is not rewritten from 1 into 0 unless the rewriting conditions CN1 to CN9 are satisfied".

A cancel statement created from the rewriting conditions CN1 to CN9 is expressed using, for example, an abort statement written in PSL. A negative statement for the description of "IntRdy0i in a register has been rewritten from 1 into 0" is expressed using, for example, a never statement written in PSL. These expressions are combined to generate the reverse-proposition verification property 112.

According to the third embodiment, a designer can cause the verification support apparatus to easily and automatically generate a reverse-proposition verification property, thereby improving the quality of the reverse-proposition verification property 112 and precision of verification. Therefore, efficiency of verification work and shortening a verification period can be achieved.

A fourth embodiment is an embodiment according to which the specification data 114 is generated automatically. The automatic generation of the specification data 114 decreases a load on a designer in making a specification. Besides, the designer can find an inconsistent point by comparing the generated specification with a specification made by the designer.

Figure 15:
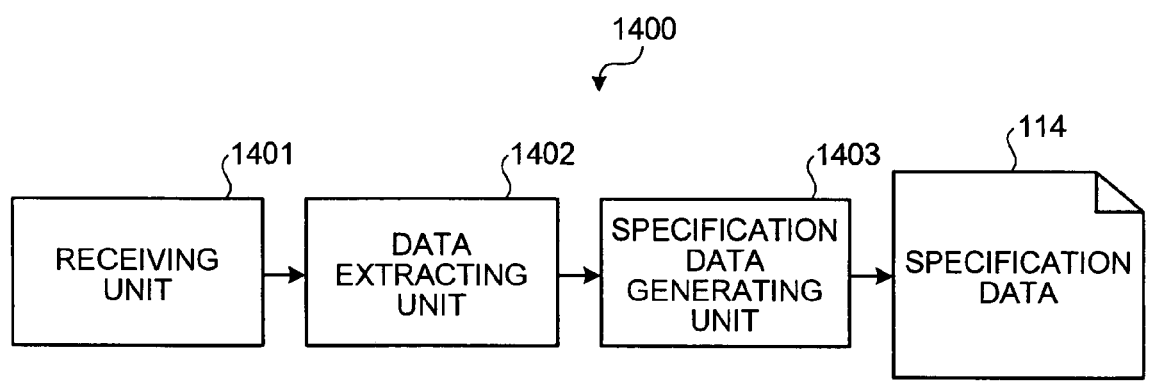
FIG. 15 is a block diagram of functional configuration of a verification support apparatus according to a fourth embodiment.

FIG. 15 is a block diagram of functional configuration of a verification support apparatus according to the fourth embodiment. A verification support apparatus 1400 includes a receiving unit 1401, a data extracting unit 1402, and a specification-data generating unit 1403.

The receiving unit 1401 receives input of the description data 111 shown in FIG. 4. The data extracting unit 1402 extracts data necessary for the generation of the specification data 114 from the description data 111. The specification-data generating unit 1403 generates the specification data 114 using the data extracted by the data extracting unit 1402.

The receiving unit 1401, the data extracting unit 1402, and the specification-data generating unit 1403 are realized by the CPU 201 that executes programs stored in recording media such as the ROM 202, the RAM 203, and the HD 205 shown in FIG. 3, or by the I/F 209.

FIG. 16 is a schematic of the generated specification data 114. A register map 1501 is a map that links an "address" to a "register name" in a register. The "address" and "register name" are extracted from the register information in the description data 111. A field map 1502 includes a "bit number", a "field name", and an "initial value".

A "bit number" is extracted from a "range" in the field information in the description data 111. An "initial value" is extracted from a "rewriting value" corresponding to a marked "initial value" column in the field information in the description data 111.

A register detail-explanatory table (bit detail explanation and change condition) 1503 is data that links a "value" to its "meaning". A "value" is extracted from a "rewriting value" in the field information in the description data 111, and a "meaning" is from "value information".

Figure 17:
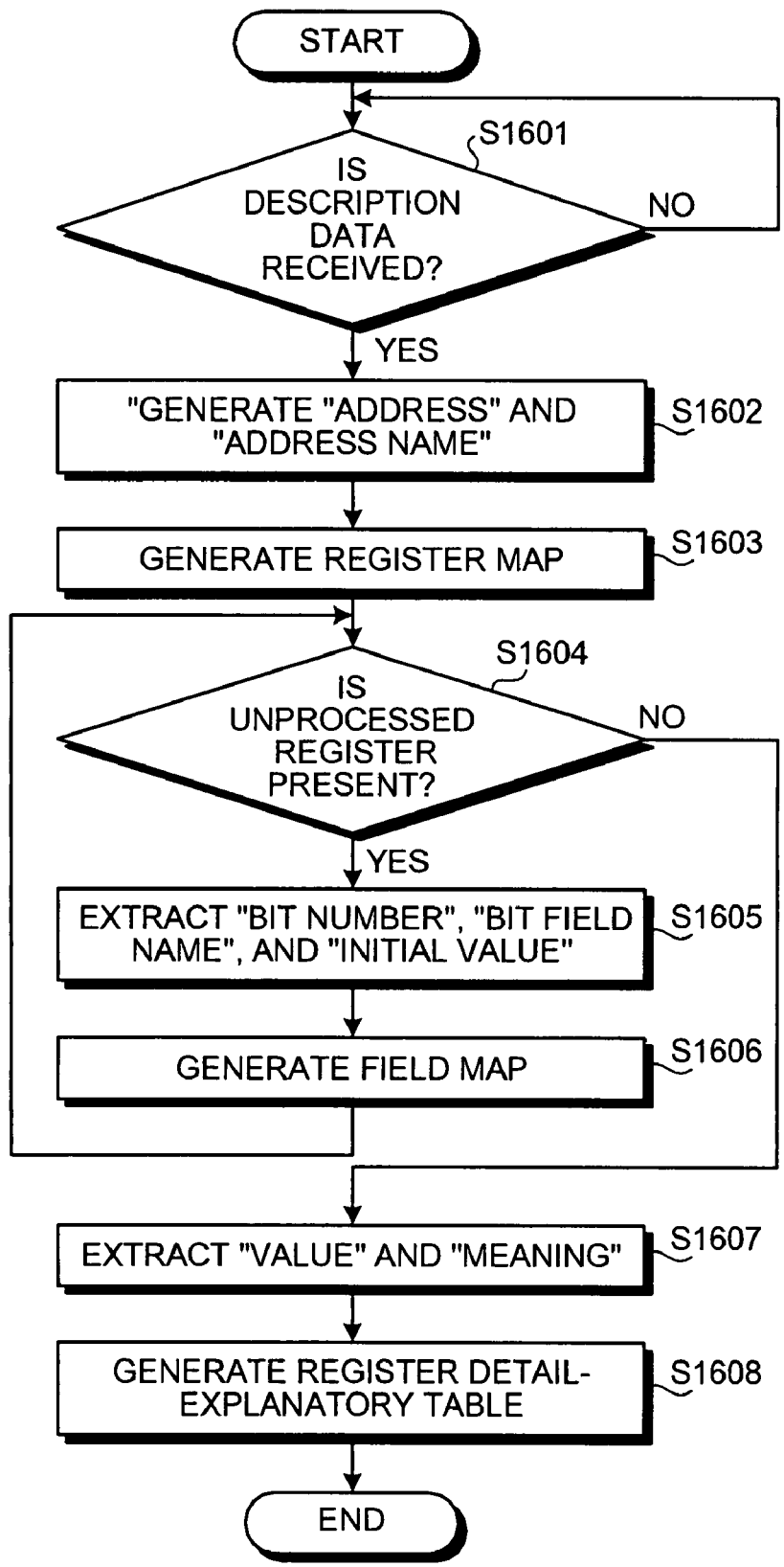
FIG. 17 is a flowchart of a verification support procedure performed by the verification support apparatus according to the fourth embodiment.

FIG. 17 is a flowchart of a verification support procedure performed by the verification support apparatus 1400 according to the fourth embodiment. When the description data 111 is received by the receiving unit 1401 (step S1601: YES), the data extracting unit 1402 extracts an "address" and a "register name" from the register information in the description data 111 (step S1602). The specification-data generating unit 1403 generates the register map 1501 (step S1603).

It is judged whether an unprocessed register is present in the generated register map 1501 (step S1604). When it is judged that an unprocessed register is present (step S1604: YES), the data extracting unit 1402 extracts a "bit number", a "field name", and an "initial value" from the description data 111 (step S1605). The specification-data generating unit 1403 generates the field map 1502 (step S1606), and the process returns to step S1604.

When it is judged that an unprocessed register is not present (step S1604: NO), the data extracting unit 1402 extracts a "value" and a "meaning" (step S1607). The specification data generating unit 1403 generates the register detail-explanatory table 1503 (step S1608), and a series of steps is finished.

According to the forth embodiment, the specification data 114 (the register map 1501, the field map 1502, and the register detail-explanatory table 1503) are automatically generated, thereby decreasing a load on a designer in making a specification. Furthermore, the designer can find an inconsistent point by comparing the generated specification data 114 with a specification made by the designer. Therefore, efficiency of verification work by the designer and shortening a verification period can be achieved.

A fifth embodiment is an embodiment according to which it is checked whether the description data 111 includes any element of deficiency using a cause/result graph. The cause/result graph is data obtained by diagraming the description data 111 shown in FIG. 4 using nodes and edges. The nodes represent causes and results (including intermediate results). A statement expressing a cause or result (including an intermediate result) is attached to the left of each node. Each edge connects one node to another node, indicating the relation between a cause and a result that are represented by the connected nodes.

Figure 18:
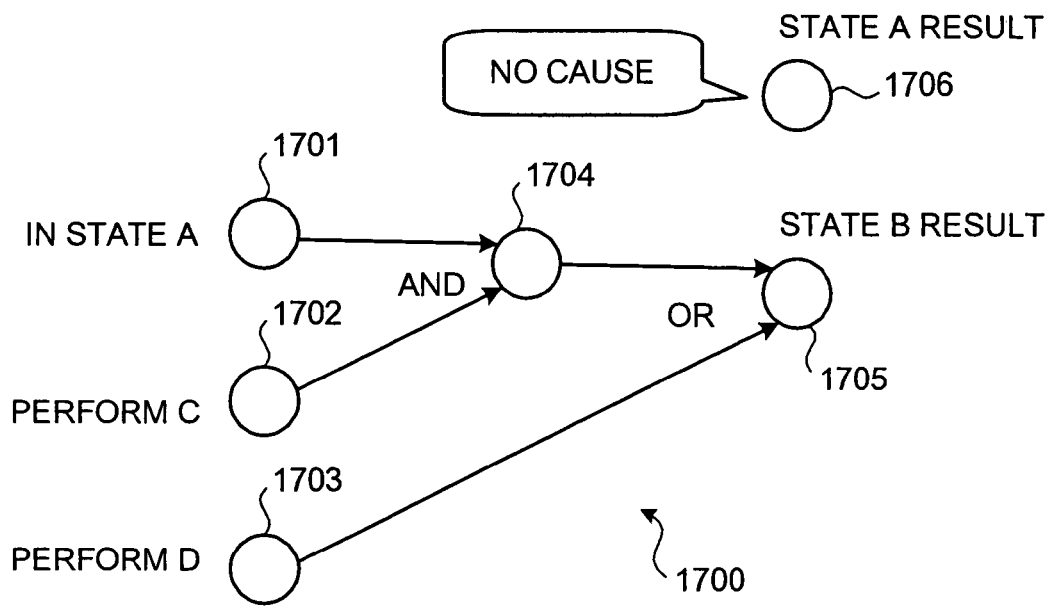
FIG. 18 is a schematic of a cause/result graph.

FIG. 18 is a schematic of a cause/result graph. In a cause/result graph 1700, nodes 1701 to 1703 represent causes of "in a state A", "perform C", and "perform D", respectively. Hereinafter, nodes representing causes are called cause nodes. Leaf nodes in the graph 1700 become cause nodes.

A node 1704 represents a logical product (AND) of the cause nodes 1701 and 1702. The nodes that are neither root nodes nor leaf nodes become intermediate nodes. A node representing a logical sum (OR) could also be an intermediate node. A node 1705 represents a result of "a state B results". Hereinafter, nodes representing results are called cause nodes. Root nodes in the graph 1700 become result nodes.

A node 1706 is not linked to the cause/result graph 1700 including the nodes 1701 to 1705. Although the node 1706 represents a result of "a state A result", the cause of that result (register rewriting condition) is not present. In the fifth embodiment, it is checked whether the description data 111 includes any element of deficiency by detecting a node such as the node 1706 from the description data 111.

To check any element of deficiency in the description data 111, a time conception is introduced into a cause/result graph. A time-based weight is added to each edge in the cause/result graph to represent the time conception. The time-based weight is expressed by appending the number of cycles to each edge in the cause/result graph.

When a time a result takes to occur has such a span as n to m cycles at a result node or an intermediate node, a time-based OR (logical sum) joint node (hereinafter, may be called "tOR") is utilized.

Figure 19:
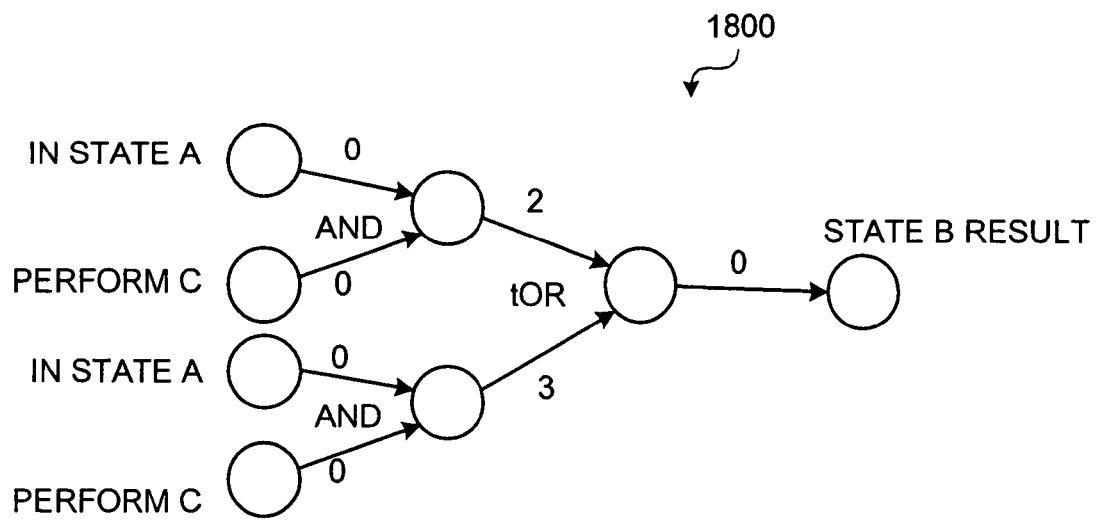
FIG. 19 is a schematic of a cause/result graph into which a time concept is introduced.

FIG. 19 is a schematic of a cause/result graph into which a time concept is introduced. The cause/result graph 1800 indicates "Perform C in a state A, and a state B results after two to three cycles".

When cause/result graphs are generated from the description data 111, a cause node of one cause/result graph is connected to a result node of another cause/result graph, the cause node coinciding with the result node, to check the consistency between both cause/result graphs.

Figure 20:
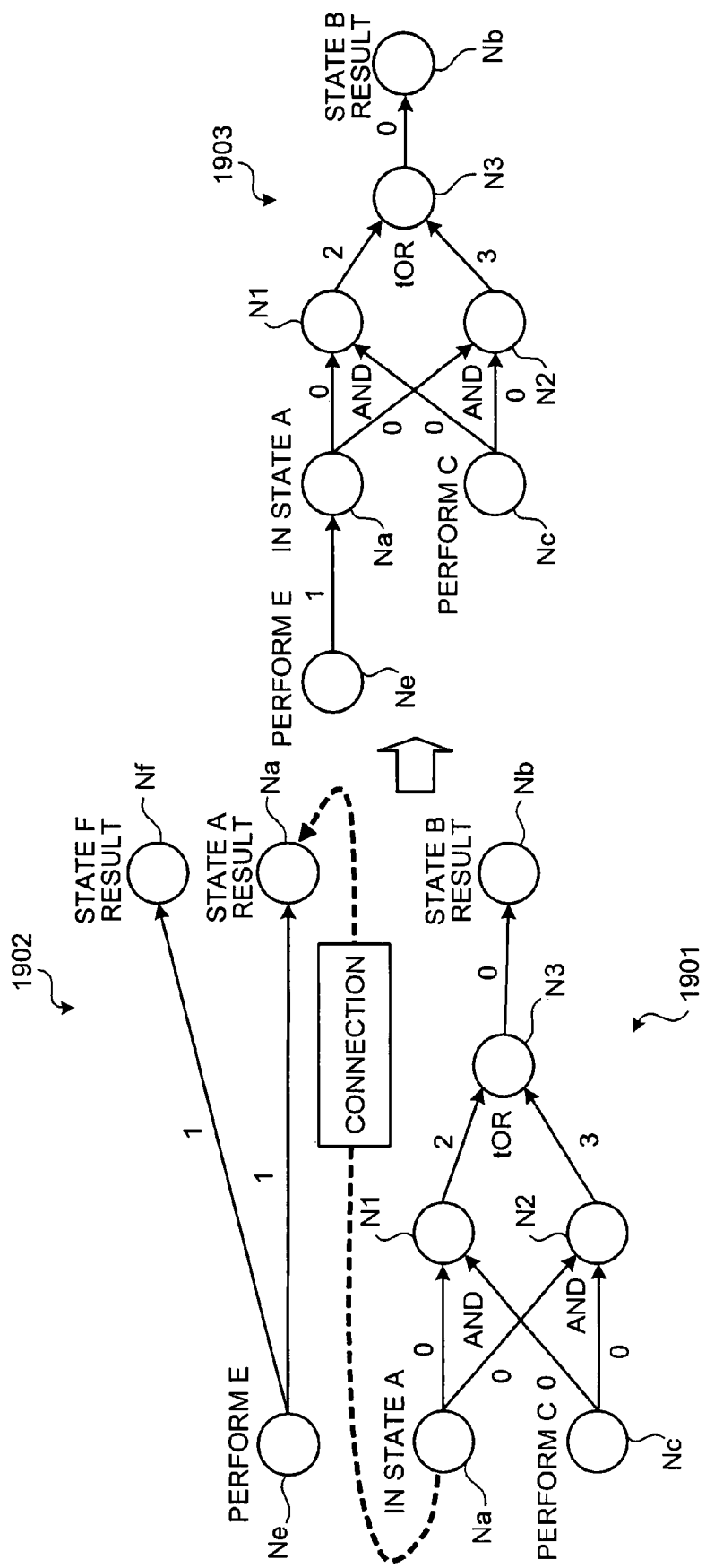
FIG. 20 is a schematic for illustrating connection of two cause/result graphs.

FIG. 20 is a schematic for illustrating connection of two cause/result graphs. A cause/result graph 1901 is a graph obtained by putting together the cause nodes of the cause/result graph 1800 shown in FIG. 19. The cause/result graph 1901 includes nodes Na, Nb, Nc, and N1 to N3. The nodes Na and Nc are cause nodes, and the node Nb is a result node. A cause/result graph 1902 includes nodes Na, Ne, and Nf. The node Ne is a cause node, and the nodes Na and Nf are result nodes.

The cause node Na of the cause/result graph 1901 coincides with the result node Na of the cause/result graph 1902. Therefore, the cause node Na and the result node Na are connected together to generate a new cause/result graph 1903.

Figure 21:
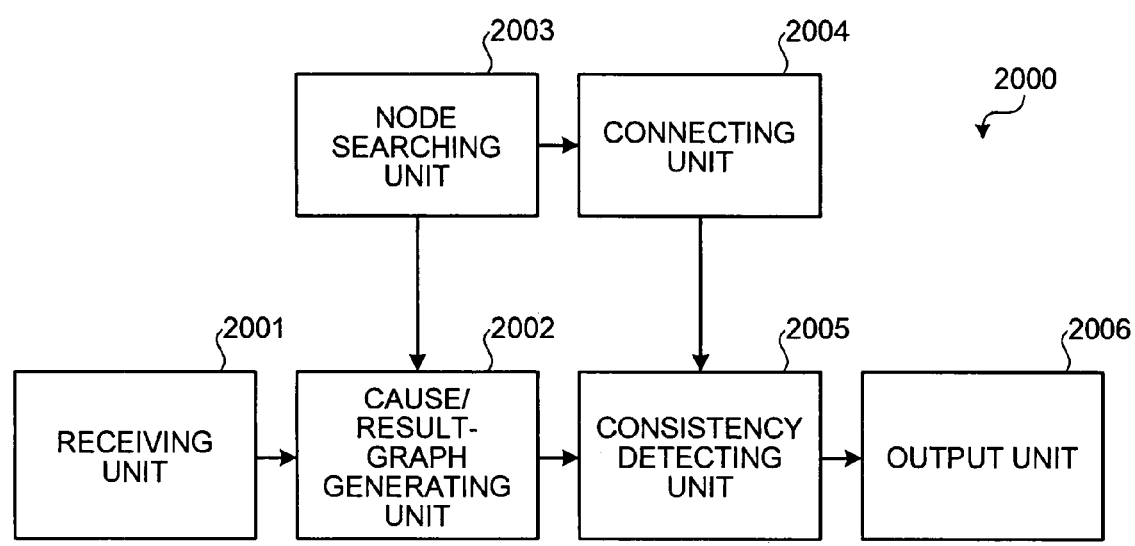
FIG. 21 is a block diagram of functional configuration of a verification support apparatus according to a fifth embodiment.

FIG. 21 is a block diagram of functional configuration of a verification support apparatus according to the fifth embodiment. A verification support apparatus 2000 includes a receiving unit 2001, a cause/result-graph generating unit 2002, a node searching unit 2003, a connecting unit 2004, a consistency detecting unit 2005, and an output unit 2006.

The receiving unit 2001 receives input of the description data 111 shown in FIG. 4. The cause/result-graph generating unit 2002 generates a cause/result graph based on the description data 111. For example, a state of a register before a change in the state is defined as a cause node, while a state of the register after the change in the state is defined as a result node, and the cause node is connected to the result node using an edge. The number of cycles is read out of the parameter N in the template information, and is defined as a time-based weight for the edge.

The node searching unit 2003 searches a result node of one cause/result graph that coincides with a cause node of another cause/result graph. Specifically, as shown in FIG. 20, the node searching unit 2003 searches the result node Na of the cause/result graph 1902 that coincides with the cause node Na of the cause/result graph 1901.

The connecting unit 2004 connects together both cause/result graphs based on a result of the search by the node searching unit 2003. Specifically, as shown in FIG. 20, when the result node coinciding with the cause node Na of the cause/result graph 1901 is present in the cause/result graph 1902, the connecting unit 2004 connects the cause node Na of the cause/result graph 1901 to the result node Na of the cause/result graph 1902 to generate the new cause/result graph 1903.

The consistency detecting unit 2005 detects a cause/result graph including only result nodes from cause/result graphs connected by the connecting unit 2004. In other words, the consistency detecting unit 2005 checks whether leaf nodes includes only external input operations in a cause/result graph generated as a result of repeated connection processes. The output unit 2006 outputs a result of the detection by the consistency detecting unit 2005 as review information 115.

The receiving unit 2001, the cause/result-graph generating unit 2002, the node searching unit 2003, the connecting unit 2004, the consistency detecting unit 2005, and the output unit 2006 are realized by the CPU 201 that executes programs stored in recording media such as the ROM 202, the RAM 203, and the HD 205 shown in FIG. 3, or by the I/F 209.

Figure 22:
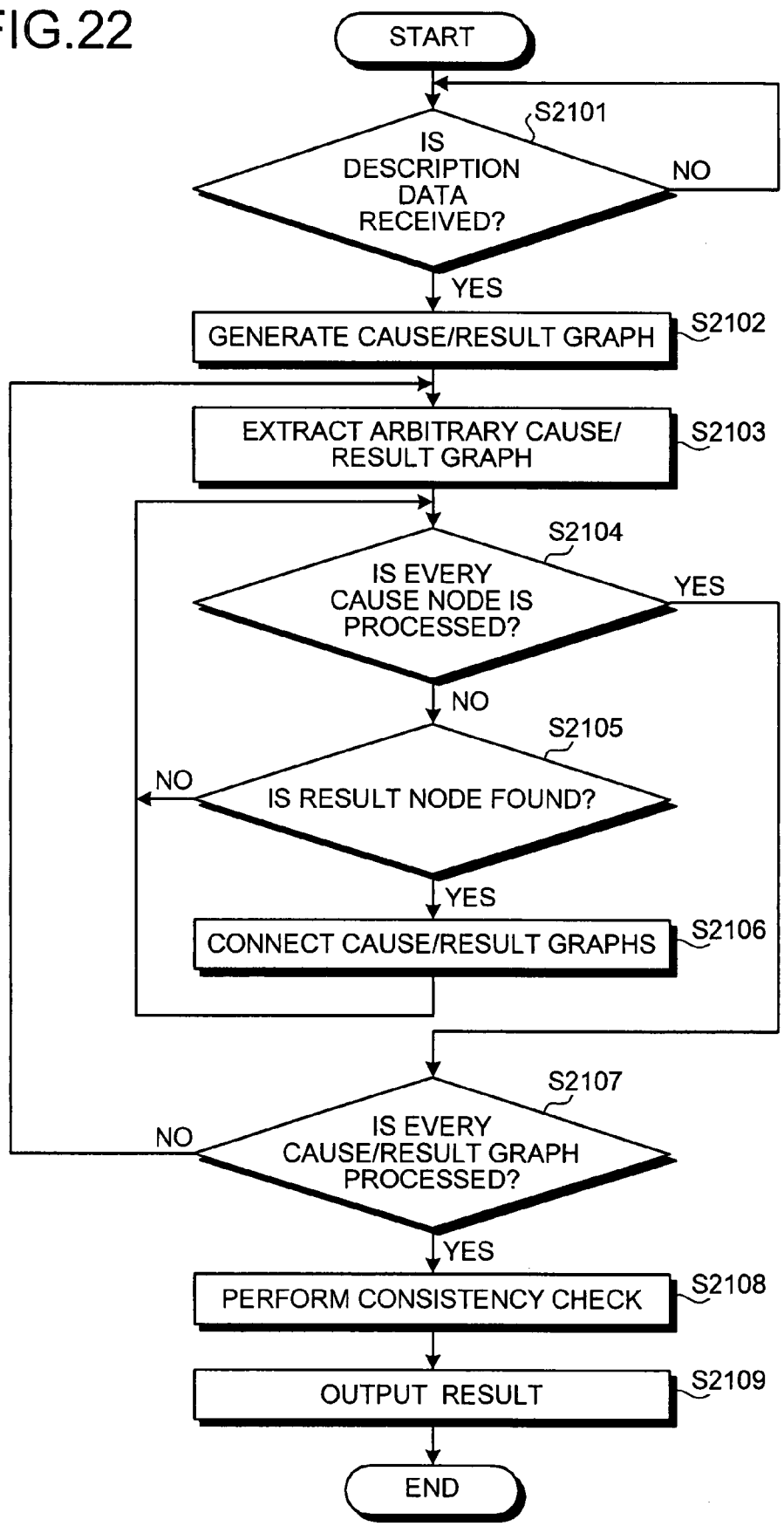
FIG. 22 is a flowchart of a verification support procedure performed by the verification support apparatus according the fifth embodiment.

FIG. 22 is a flowchart of a verification support procedure performed by the verification support apparatus 2000 according the fifth embodiment. When the cause/result description data 111 is received by the receiving unit 2001 (step S2001: YES), the cause/result-graph generating unit 2002 generates cause/result graphs (step S2102). The node searching unit 2003 extracts an arbitrary cause/result graph from a group of generated cause/result graphs (step S2103).

When every cause node of the extracted cause/result graph is not processed (step S2104: NO), it is judged whether a result node coinciding with a cause node of the extracted cause/result graph is found in another cause/result graph by the node searching unit 2003 (step S2105). When such a result node is found (step S2105: YES), the connecting unit 2004 connects both cause/result graphs (step S2106), and the process returns to step S2104. When such a result node is not found (step S2105: NO), the process returns to step S2104.

When every cause node of the extracted cause/result graph is processed (at step S2104: YES), it is judged whether every generated cause/result graph is processed (step S2107). When it is judged that not every generated cause/result graph is processed (step S2107: NO), the process returns to step S2103. When it is judged that every generated cause/result graph is processed (step S2107: YES), the consistency detecting unit 2005 performs consistency check (step S2108), and the output unit 2006 outputs a result of the check by the consistency detecting unit 2005 as the review information 115 (step S2109), and a series of steps is finished.

According to the fifth embodiment, the consistency check whether the description data 111 includes any element of deficiency can be performed using cause/result graphs. Therefore, a designer can check the cause/result description data 111 before generating a verification property 112, and review the description data 111 when the description data 111 includes any element of deficiency.

A high quality verification property 112 and specification data 114 can be automatically generated by applying the reviewed description data 111 to each of the above first to fourth embodiments, and prevents generation of an erroneous verification property 112 and specification data 114.

A sixth embodiment is an embodiment according to which it is checked whether the description data 111 includes any inconsistency using the cause/result graphs shown in the fifth embodiment. The check is performed between the cause/result graphs by checking whether an exclusive relation is present between-synchronous nodes.

For example, when one node of synchronous nodes represents a result of "IntRdy0i in a register has been rewritten from 1 to 0", and the other node of synchronous nodes represents a result of "IntRdy0i in a register has been rewritten from 0 to 1", both nodes are inconsistent with each other.

Figure 23:
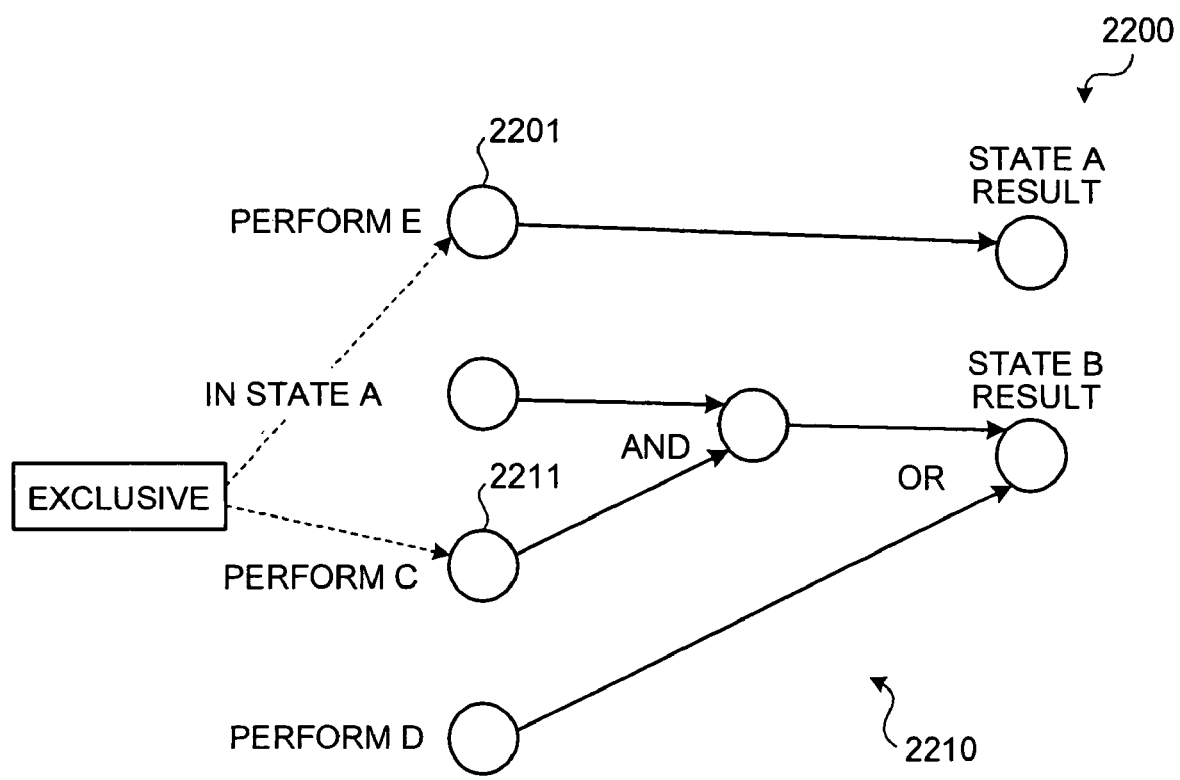
FIG. 23 is a schematic for illustrating inconsistency between cause/result graphs according to a sixth embodiment.

FIG. 23 is a schematic for illustrating the exclusive relation between cause/result graphs according to the sixth embodiment. A cause/result graph 2200 and a cause/result graph 2210 represent the state before the connecting process according to the fifth embodiment. It is checked whether an exclusive relation is present between a cause node 2201 of the cause/result graph 2200 and a cause node 2211 of the cause/result graph 2210.

Before checking whether inconsistency is present, cause/result graphs are connected, and a time-based weight indicating a time distance is appended to each edge of the graphs as shown in the fifth embodiment. When plural paths from a certain node to a result node are present with different time distances to the result node, the node is expanded into plural nodes, which are marked with labels to avoid confusion.

Figure 24:
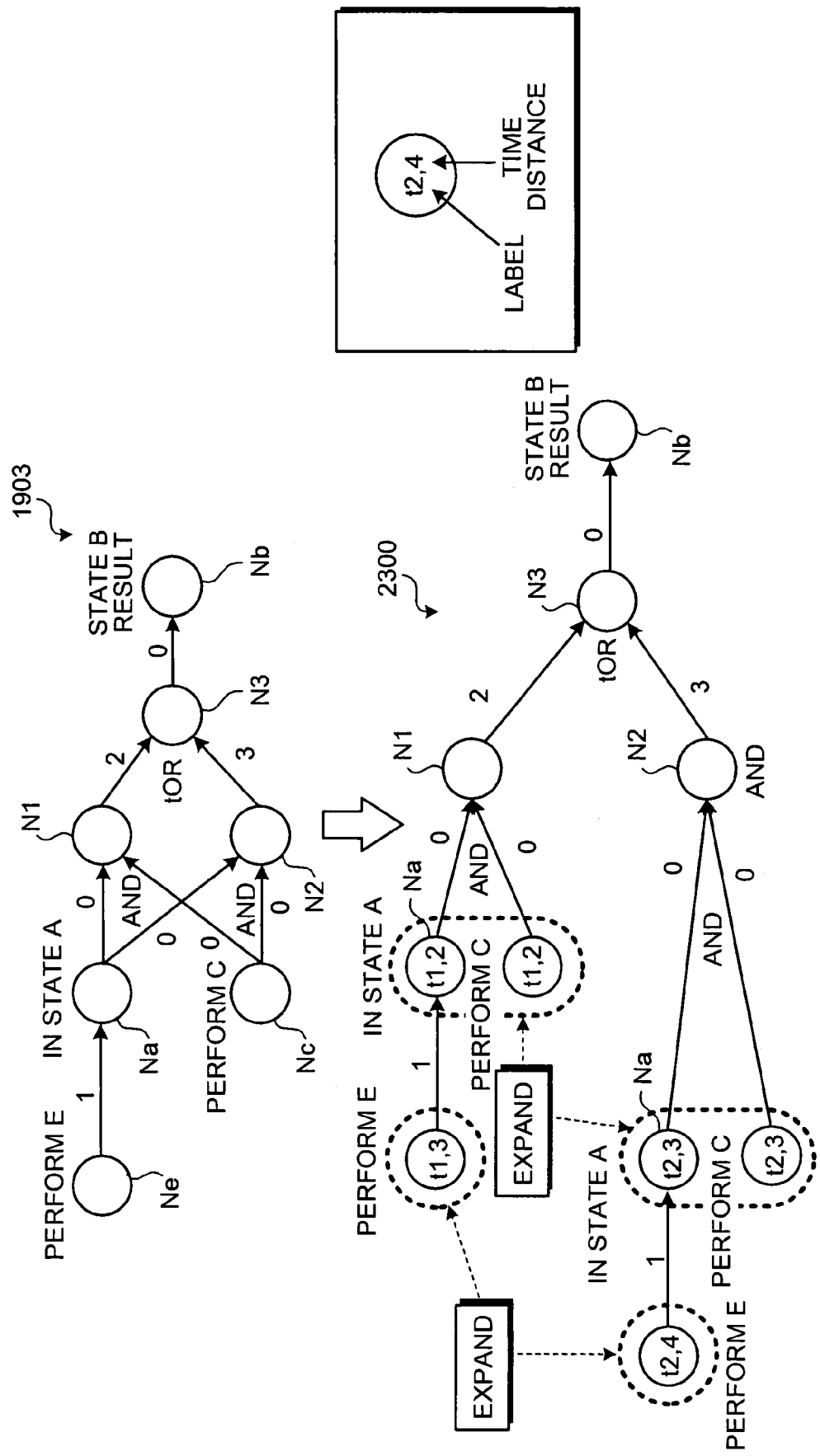
FIG. 24 is a schematic for illustrating a state of expansion of a cause/result graph after a connecting process.

FIG. 24 is a schematic for illustrating a state of expansion of a cause/result graph after a connecting process. Here, the cause/result graph 1903 after the connecting process shown in FIG. 20 will be expanded. When a route from a result node Nb back to a node Na is traced, two paths are specified. One is a path of Nb-N3-N1-Na, where the total time distance from the node Na to the node Nb becomes "2", which is the sum of time-based weights added to edges in the path.

Another one is a path of Nb-N3-N2-Na, where the total time distance from the node Na to the node Nb becomes "3", which is the sum of time-based weights added to edges in the path. As a result, plural paths leading from the node Na to the result node Nb provide the same number of time-based distances as the paths.

In such a case, the node Na is expanded for each path. The node Na is expanded to yield two nodes Na, which are marked with labels for distinction. For the path of Nb-N3-N1-Na with the time-based distance "2", the node Na is marked with a label t1 and the time-based distance "2", while for the path of Nb-N3-N2-Na with the time-based distance "3", the node Na is marked with a label t2 and the time-based distance "3". A node Nc and a node Ne are also expanded in the same manner.

Each node in the same path is marked with the same label. For example, a node in the path of Nb-N3-N1-Na including the node N1 is marked with the same label t1, and a node in the path of Nb-N3-N2-Na including the node N2 is marked with the same label t2.

A cause/result graph 2300 is obtained by expanding the cause/result graph 1903 in the above manner. Since the expanded nodes are present in the number of expansion, the expanded nodes are distinguished from each other using labels and time distances. For example, as two expanded nodes Na are present after expansion, one node Na is expressed as node Na (t1, 2), while the other node Na is expressed as node Na (t2, 3).

When a result node of another cause/result graph is linked to a cause node of an expanded cause/result graph obtained by the above expansion process, the result node is added to the expanded cause/result graph. The expanded cause/result graph 1903 is originally a graph obtained by connecting the cause/result graph 1901 to the cause/result graph 1902 shown in FIG. 20. After the connecting process, the cause/result graph 1903 has the only result node of result node Nb, and a result node Nf of the cause/result graph 1902 is excluded from the cause/result graph 1903. However, the result node Nf is added to the expanded cause/result graph 1903.

Figure 25:
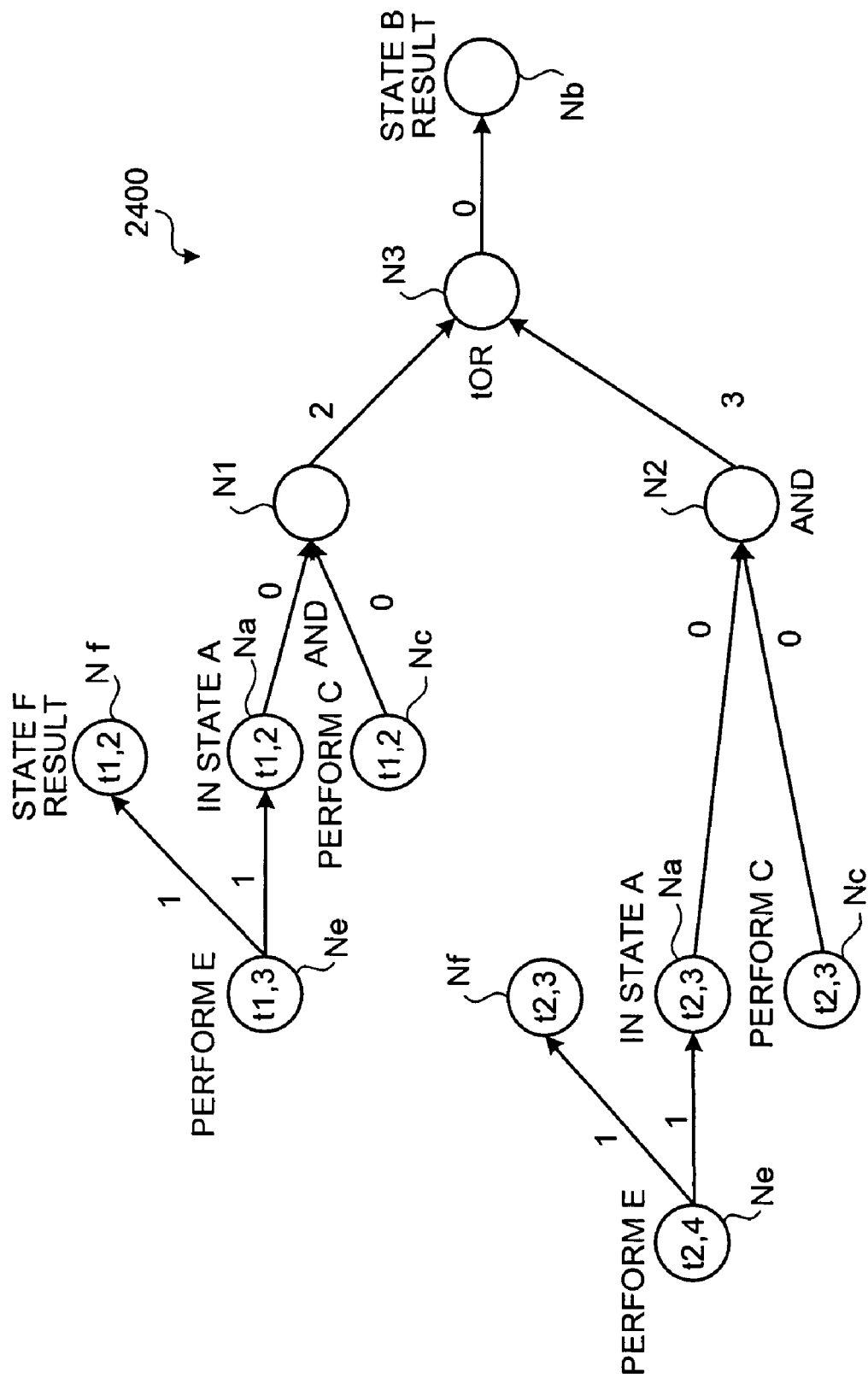
FIG. 25 is a schematic of a cause/result graph after an adding process.

FIG. 25 is a schematic of a cause/result graph after an adding process. A cause/result graph 2400 is a graph obtained by adding the result node Nf shown in FIG. 20 to the cause/result graph 2300 shown in FIG. 24.

Plural (two in the graph 2400) cause nodes Ne corresponding to the added result node Nf are present as a result of expansion. The result node Nf is marked with the same label t1 corresponding to the cause node Ne (t1, 3). The time distance of the result node Nf is obtained by deducting, from the time distance of the cause node Ne, the time-based weight between the cause node Ne and the result node Nf in the cause/result graph before the connection shown in FIG. 20.

Since the time distance of the cause node Ne (t1, 3) is "3" and the time-based weight of the edge between the cause node Ne and the result node Nf is "1", the time distance of the node Nf becomes "2". Likewise, the node Nf is also added corresponding to the cause node Ne (t2, 4), and is defined as the result node Nf (t2, 3).

It is checked whether an exclusive relation is present between nodes marked with the same labels and the same time distances. The exclusive relation to be checked includes one that is specified by a user, and one that is automatically extracted such as a relation indicating different rewriting values present in the same field.

Figure 26:
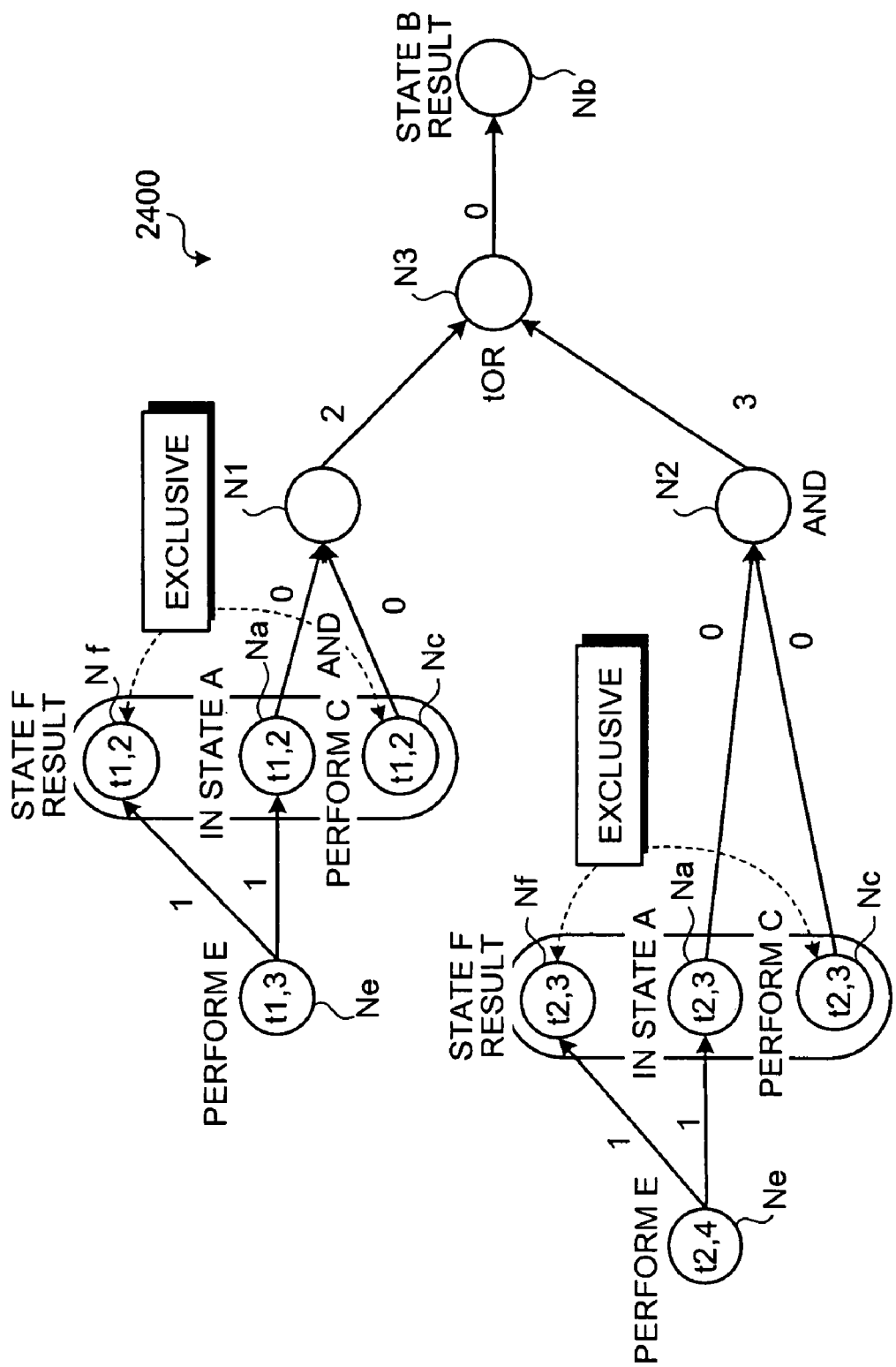
FIG. 26 is a schematic of a cause/result graph including inconsistency.

FIG. 26 is a schematic of a cause/result graph including inconsistency. For example, it is checked whether an exclusive relation is present between a node Nf (t1, 2) and a node Nc (t1, 2) having the same labels and time distances. Likewise, it is checked whether an exclusive relation is present between a node Nf (t2, 3) and a node Nc (t2, 3). When both nodes have different labels or different time distances, no inconsistency is present even if the exclusive relation is present between the nodes.

Figure 27:
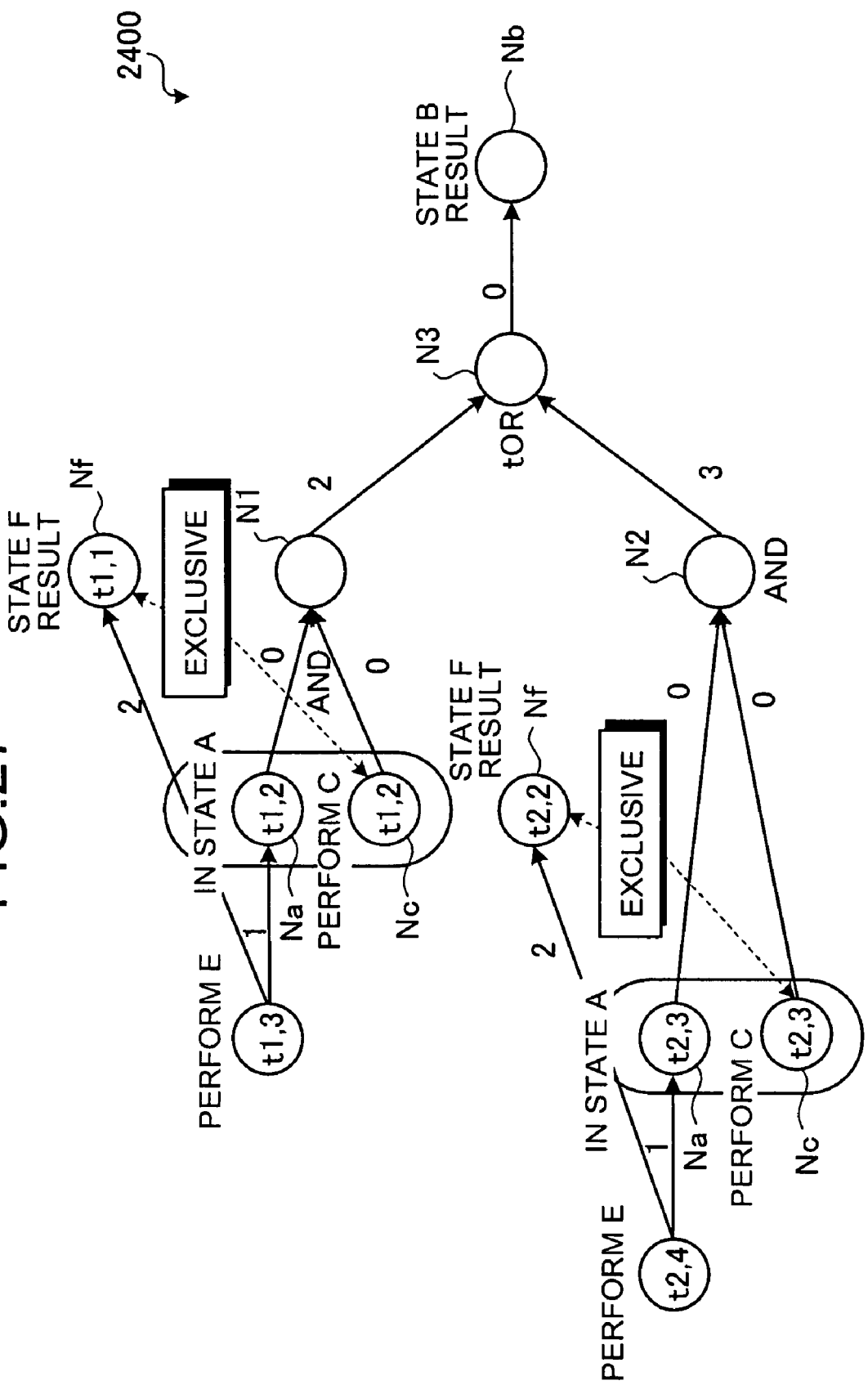
FIG. 27 is a schematic of a cause/result graph including no inconsistency.

FIG. 27 is a schematic of a cause/result graph including no inconsistency. A node Nf (t1, 1) and a node Nc (t1, 2) are different in time distance from each other. Therefore, even if an exclusive relation is present between the node Nf (t1, 1) and the node Nc (t1, 2), the nodes Nf and Nc coexist without inconsistency due to the difference between both time distances. The same conclusion applies to the relation between a node Nf (t2, 2) and a node Nc (t2, 3).

Figure 28:
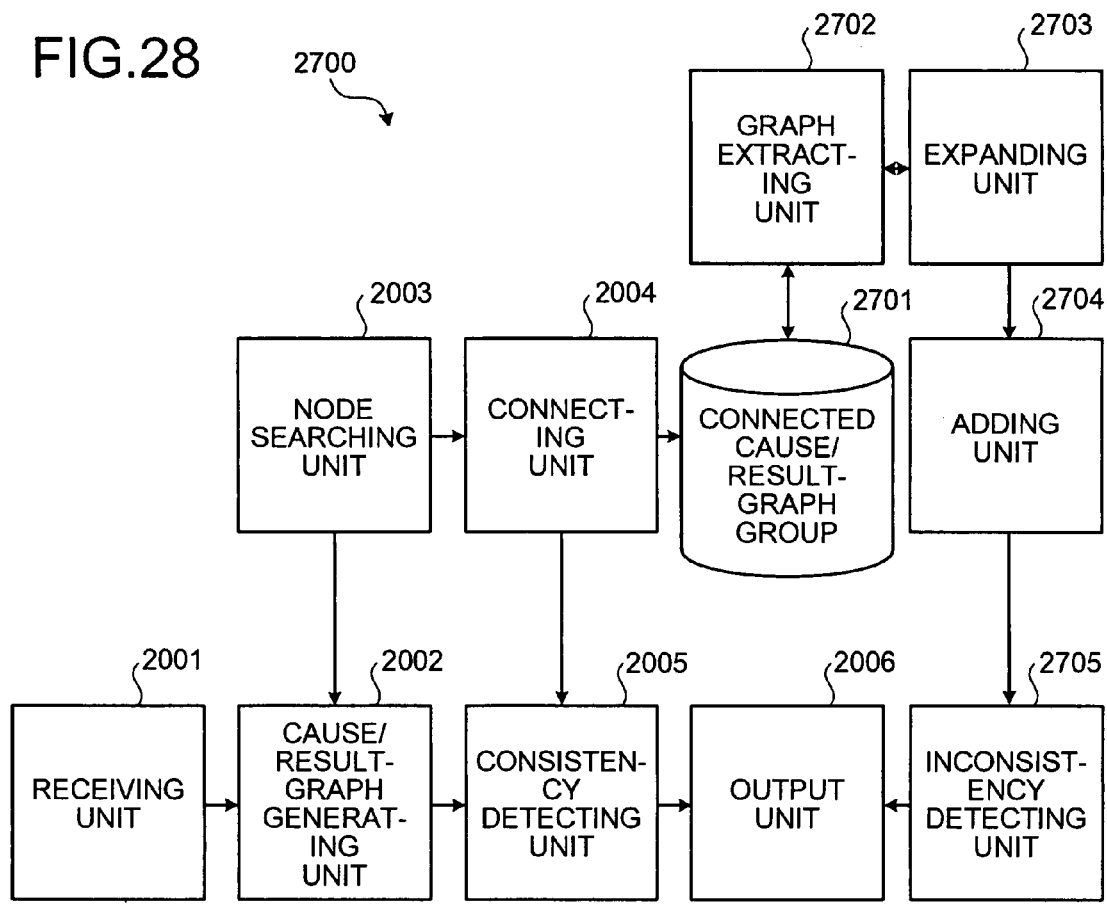
FIG. 28 is a block diagram of functional configuration of a verification support apparatus according to a sixth embodiment.

FIG. 28 is a block diagram of functional configuration of a verification support apparatus according to the sixth embodiment. The same components as shown in the fifth embodiment are denoted by the same reference numerals in the fifth embodiment, and the explanation thereof is omitted. A verification support apparatus 2700 includes the receiving unit 2001, the cause/result-graph generating unit 2002, the node searching unit 2003, the connecting unit 2004, the consistency detecting unit 2005, the output unit 2006, a connected cause/result-graph group 2701, a graph extracting unit 2702, an expanding unit 2703, an adding unit 2704, and an inconsistency detecting unit 2705.

The connected cause/result-graph group 2701 is a group of cause/result graphs connected by the connecting unit 2004. The graph extracting unit 2702 extracts a connected cause/result graph from the connected cause/result-graph group 2701. The expanding unit 2703 executes the expanding process shown in FIG. 24 for the extracted connected cause/result-graph. The adding unit 2704 adds a result node excluded by the connecting unit 2004 to the connected cause/result graph subjected to the expanding process, as shown in FIG. 25.

The inconsistency detecting unit 2705 checks whether an exclusive relation is present between two or more nodes having the same labels and time distances in the cause/result graph subjected to the adding process. The output unit 2006 outputs a result of detection by the inconsistency detecting unit 2705 as review information 115.

The graph extracting unit 2702, the expanding-unit 2703, the adding unit 2704, and the inconsistency detecting unit 2705 are realized by the CPU 201 that executes programs stored in recording media such as the ROM 202, the RAM 203, and the HD 205 shown in FIG. 3, or by the I/F 209.

Figure 29:
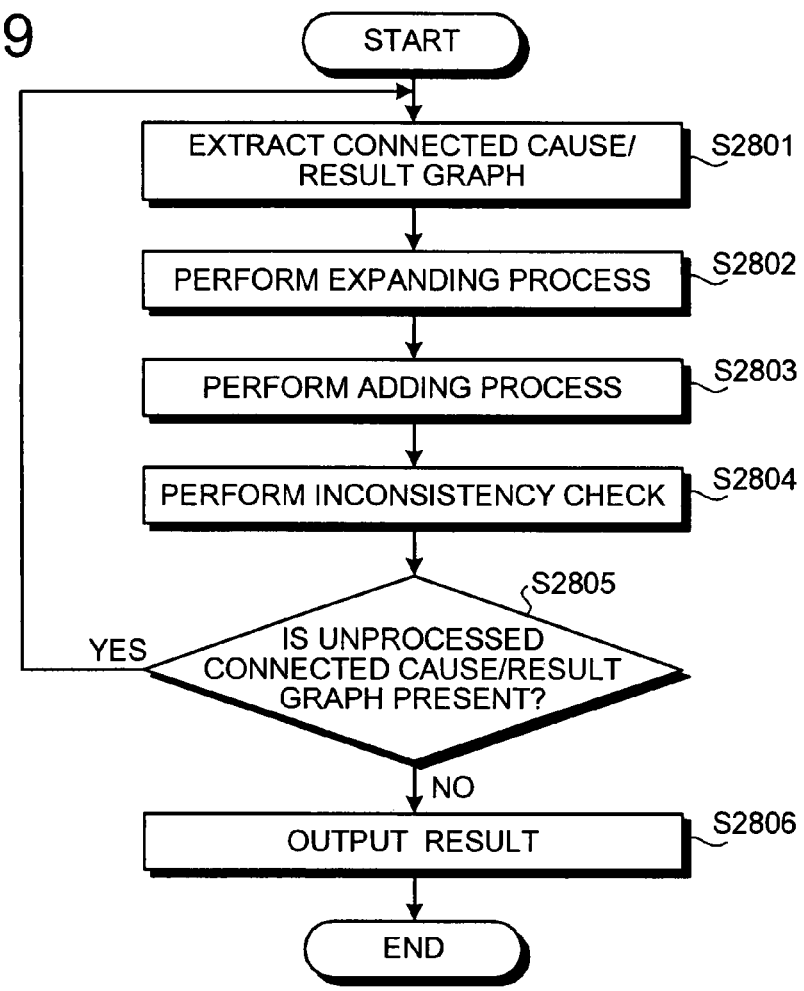
FIG. 29 is a flowchart of a verification support procedure performed by the verification support apparatus according to the sixth embodiment.

FIG. 29 is a flowchart of a verification support procedure performed by the verification support apparatus 2700 according to the sixth embodiment. The graph extracting unit 2702 extracts a connected cause/result graph (step S2801). The expanding unit 2703 performs the expanding process (step S2802), and the adding unit 2704 adds a result node if any result node to add is present (step S2803).

The inconsistency detecting unit 2705 performs an inconsistency check (step S2804). When an unprocessed connected cause/result graph is present (step S2805: YES), the process returns to step S2801. When an unprocessed connected cause/result graph is not present (step S2805: NO), the output unit 2006 outputs a result of the inconsistency check as the review information 115 (step S2806), and a series of steps is finished.

According to the sixth embodiment, it can be checked whether the description data 111 includes inconsistency using cause/result graphs. Therefore, a designer can check the description data 111 before generating a verification property 112, and review the description data 111 when the data 111 includes any inconsistency.

A high quality verification property 112 and specification data 114 can be automatically generated by applying the reviewed description data 111 to each of the above first to fourth embodiments, and prevents the generation of an erroneous verification property 112 and specification data 114.

A seventh embodiment is an embodiment according to which a scenario 113 connecting at least several causes to results is selected from cause/result graphs using cause/result graphs shown in the fifth embodiment. This enables the generation of an efficient verification scenario 113. Cause/result graphs are connected to constitute the verification scenario 113 as a cause node and a result node of the graphs are connected together directly or indirectly via another node.

Figure 30:
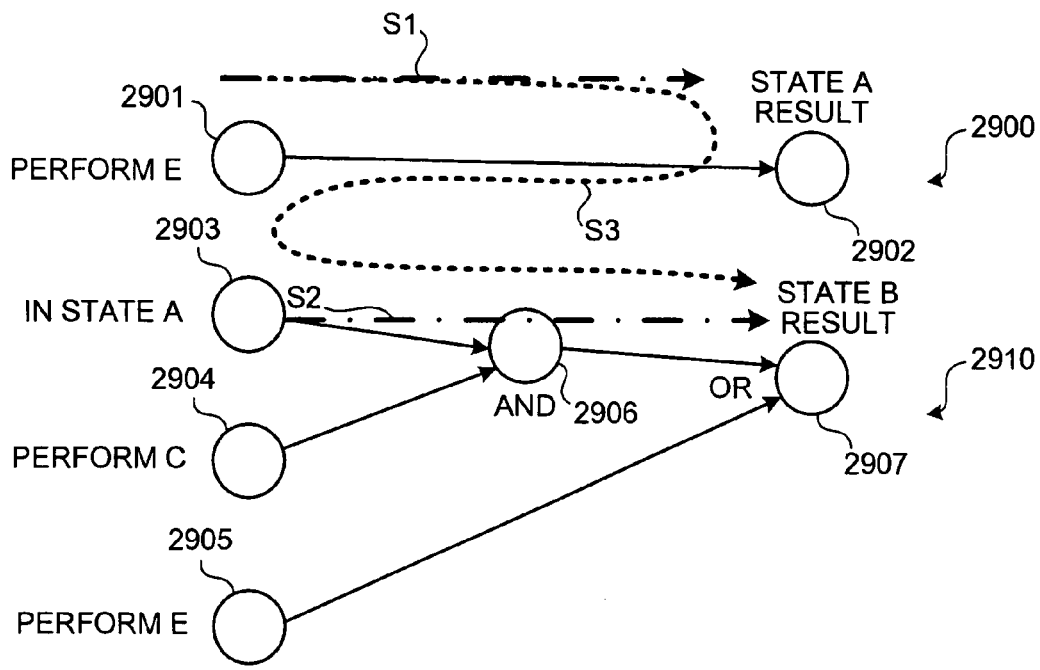
FIG. 30 is a schematic for illustrating selection of a verification scenario from cause/result graphs.

FIG. 30 is a schematic for illustrating selection of the verification scenario 113 from cause/result graphs. A cause/result graph 2900 is obtained by connecting a cause node 2901 to a result node 2902. The graph 2900 represents a verification scenario S1 that indicates when a cause (condition) of "perform E" represented by the cause node 2901 is satisfied, a result of "a state A results" occurs.

A cause/result graph 2910 is obtained by connecting together cause nodes 2903 to 2905, an intermediate result node 2906, and a result node 2907. The graph 2910 represents a verification scenario S2 that indicates when a cause node 2903 of "in a state A" and a cause node 2904 of "perform C" are satisfied (corresponding to the intermediate result node 2906 representing logical product "AND"), at least the result node 2907 of "a state B results" occurs (because the result node 2907 is an OR node).

Thus, different cause/result graphs produce different verification scenarios 113 in corresponding number. However, a large number of verification scenarios 113 cause a cumbersome situation. In this case, the cause/result graph 2900 is connected to the cause/result graph 2910 by the connecting unit 2004 shown in the fifth embodiment, using the fact that the result node 2902 of the cause/result graph 2900 coincides with the cause node 2903 of the cause/result graph 2910. Thus, a verification scenario S3 that is the integration of the verification scenarios S1 and S2 can be obtained.

Logic verification by the verification apparatus 102 using only the verification scenario S3 eliminates a need of logic verification using the verification scenarios S1 and S2, thereby reducing the times of logic verification.

Figure 31:
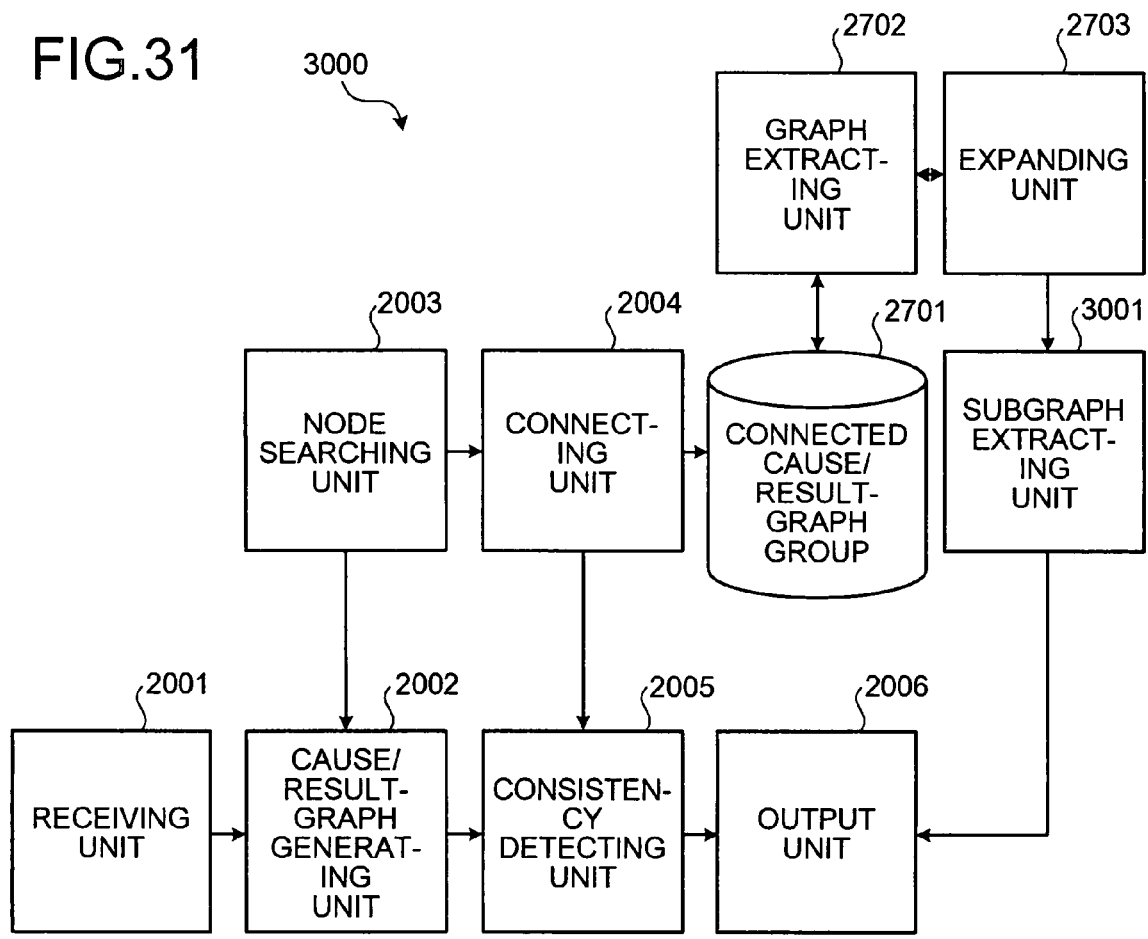
FIG. 31 is a block diagram of functional configuration of a verification support apparatus according to a seventh embodiment.

FIG. 31 is a block diagram of functional configuration of a verification support apparatus according to the seventh embodiment. The same components as shown in the fifth and sixth embodiments are denoted by the same reference numerals in the embodiments, and the explanation thereof is omitted. The verification support apparatus 3000 includes the receiving unit 2001, the cause/result-graph generating unit 2002, the node searching unit 2003, the connecting unit 2004, the consistency detecting unit 2005, the output unit 2006, the connected cause/result-graph group 2701, the graph extracting unit 2702, the expanding unit 2703, and a sub-graph extracting unit 3001.

The sub-graph extracting unit 3001 extracts sub-graphs from a cause/result graph expanded by the expanding unit 2703. Specifically, the sub-graph extracting unit 3001 detects an OR node or tOR node of the expanded cause/result-graph, and separates node groups prior to the OR node or tOR node.

Figure 32:
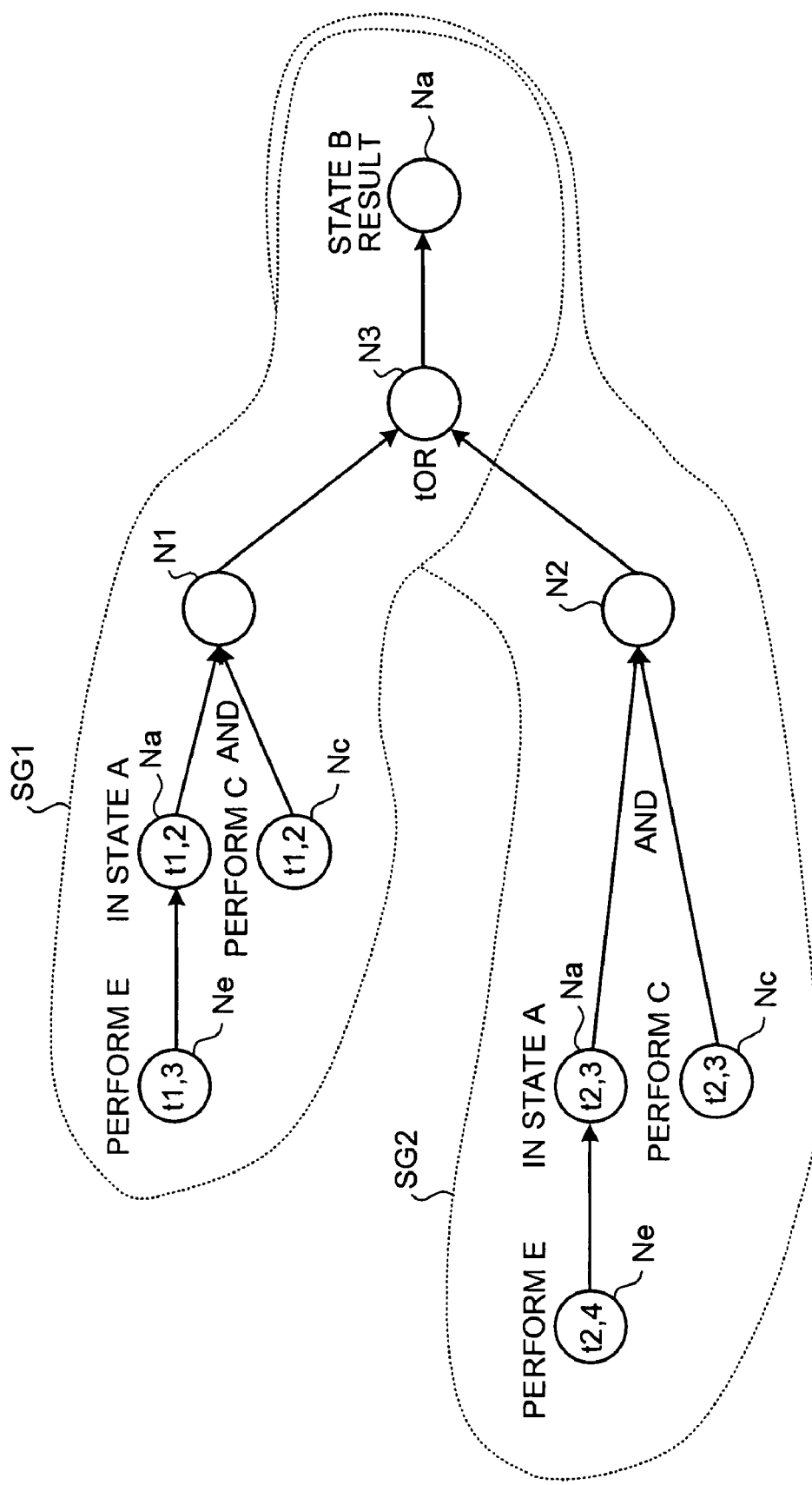
FIG. 32 is a schematic for illustrating extraction of subgraphs.

FIG. 32 is a schematic for illustrating extraction of sub-graphs. A node N1 is an AND node, so that a node group prior to the node N1 (a node Ne (t1, 3), a node Na (t1, 2)) and a node Nc (t1, 2) are not separated from each other. The same process as executed for the node N1 applies to a node N2.

On the other hand, since a node N3 is a tOR node, one node group prior to the node N3 (nodes Ne (t1, 3), Na (t1, 2), Nc (t1, 2), and N1) is separated from the other node group prior to the node N3 (nodes Ne (t2, 4), Na (t2, 3), Nc (t2, 3), and N2) to extract a sub-graph SG1 and a sub-graph SG2. The extracted sub-graphs SG1 and SG2 include AND joints, but do not include OR and tOR joints.

Thus, a verification scenario 113 that is represented by the sub-graph SG1 (nodes Ne (t1, 3), Na (t1, 2), Nc (t1, 2), N1, N2, and Nb), and another verification scenario 113 that is represented by the sub-graph SG2 (nodes Ne (t2, 4), Na (t2, 3), Nc (t2, 3), N2, N3, and Nb) can be obtained.

The sub-graph extracting unit 3001 is realized by the CPU 201 that executes programs stored in recording media such as the ROM 202, the RAM 203, and the HD 205 shown in FIG. 3, or by the I/F 209.

Figure 33:
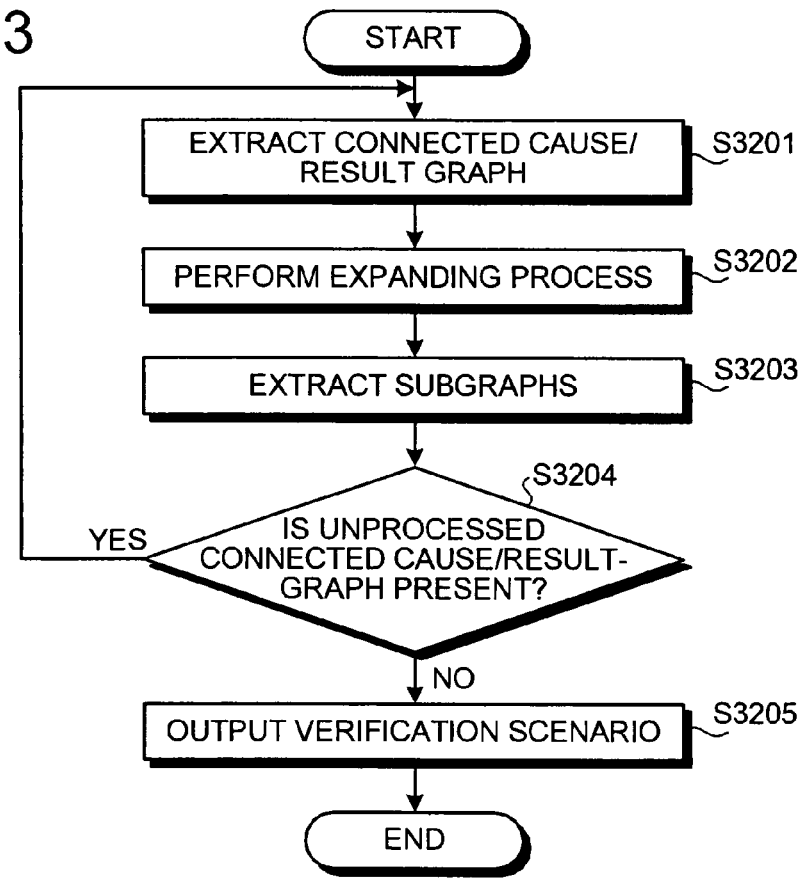
FIG. 33 is a flowchart of a verification support procedure performed by the verification support apparatus 3000 according to the seventh embodiment.

FIG. 33 is a flowchart of a verification support procedure performed by the verification support apparatus 3000 according to the seventh embodiment. The graph extracting unit 2702 extracts a connected cause/result graph (step S3201). The expanding unit 2703 performs the expanding process for the extracted cause/result graph (step S3202).

The sub-graph extracting unit 3001 extracts sub-graphs from the cause/result graph subjected to the expanding process (step S3203). When an unprocessed connected cause/result-graph is present (step S3204: YES), the process returns to step S3201. When an unprocessed connected cause/result-graph is not present (step S3204: NO), the output unit 2006 outputs a verification scenario 113 (step S3205), and a series of steps is finished.

According to the seventh embodiment, an efficient verification scenario 113 can be automatically generated using a cause/result graph, thereby shortening a verification period.

A eighth embodiment is an embodiment according to which a property for measuring the coverage of a condition of setting a register value to a specified value based on a generated register-rewriting condition is automatically generated. Check on the occurrence of rewriting requires a precondition that a rewriting condition must have been satisfied at least once. When the rewriting condition has been satisfied at least once and no error has occurred, a conclusion is made that rewriting has been done correctly.

Specifically, coverage information is generated for a verification property 112 used for logic verification to tell a designer that the logic verification has been done because rewriting of a register based on a rewriting condition has been verified. The coverage information is generated by expressing the original verification property 112, for example, in a cover statement written in PSL. Thus, it can be judged which verification property 112 is checked in a verification process.

Figure 34:
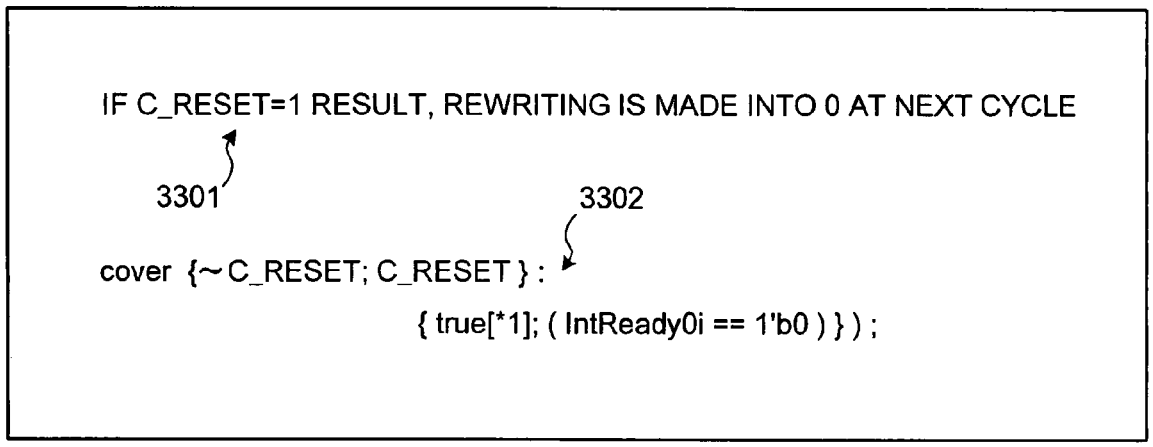
FIG. 34 is a schematic for illustrating generation of coverage information.

FIG. 34 is a schematic for illustrating generation of coverage information. A verification property 3301 indicates "If C_RESET=1 results, rewriting is made into 0 at the next cycle". The verification property 3301 is converted into coverage information 3302 when the verification support apparatus receives a verification completed signal from the verification apparatus 102 or a verification completed operational-input from a designer. The coverage information 3302 is a cover statement on the verification property 3301.

Figure 35:
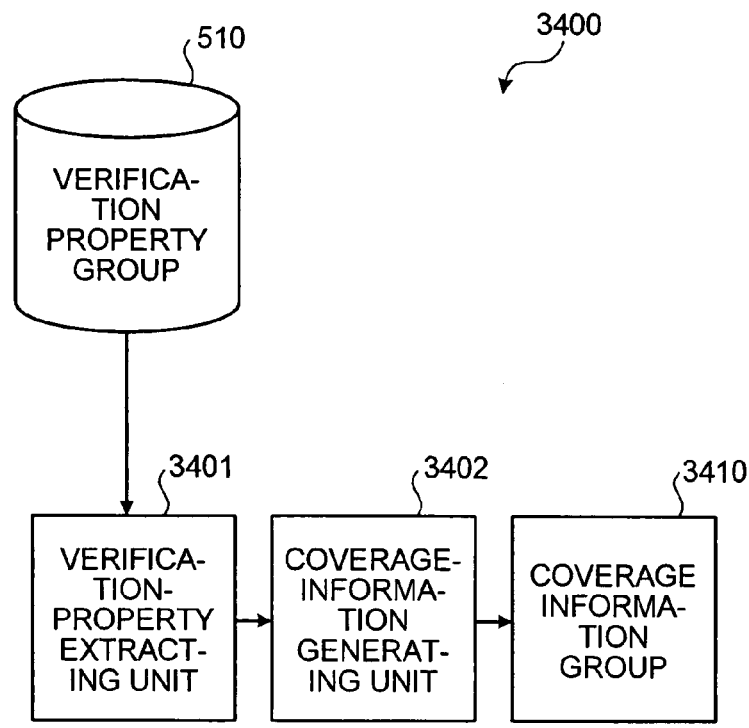
FIG. 35 is a block diagram of functional configuration of a verification support apparatus according to the eighth embodiment.

FIG. 35 is a block diagram of functional configuration of a verification support apparatus according to the eighth embodiment. The same components as shown in the first embodiment are denoted by the same reference numerals in the first embodiment, and the explanation thereof is omitted.

A verification support apparatus 3400 includes a verification-property extracting unit 3401 and a coverage-information generating unit 3402. The verification-property extracting unit 3401 extracts, from a verification property group 510, a verification property 112 to be subjected to logic verification.

The verification-property extracting unit 3401 and the coverage-information generating unit 3402 are realized by the CPU 201 that executes programs stored in recording media such as the ROM 202, the RAM 203, and the HD 205 shown in FIG. 3, or by the I/F 209.

Figure 36:
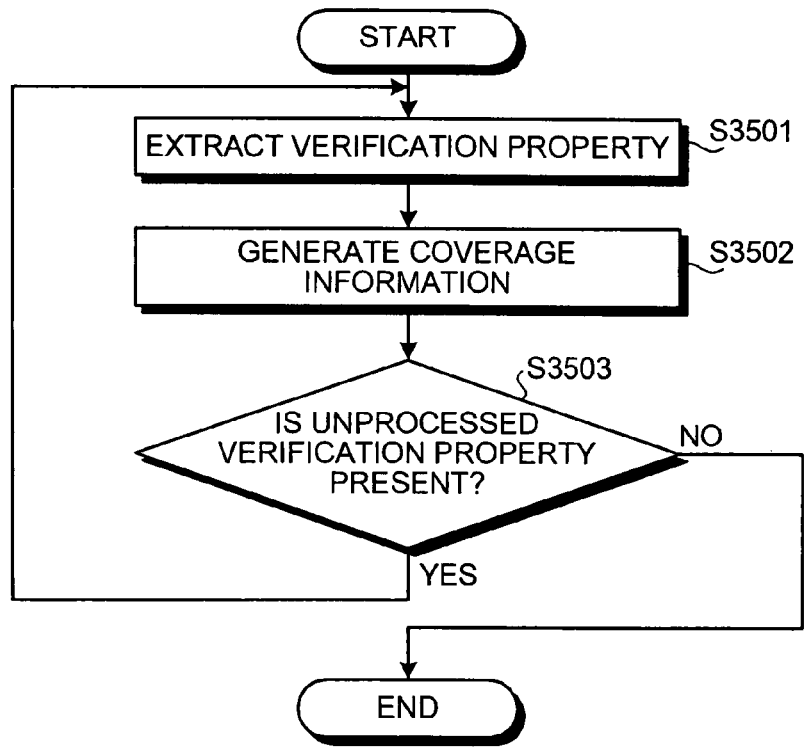
FIG. 36 is a flowchart of a verification support procedure performed by the verification support apparatus according to the eighth embodiment.

FIG. 36 is a flowchart of a verification support procedure performed by the verification support apparatus 3400. The verification-property extracting unit 3401 extracts a verification property 112 used for logic verification (step S3501).

The coverage-information generating unit 3402 generates coverage information on the verification property 112 (step S3502). It is judged whether an unprocessed verification property 112 is present (step S3503). When an unprocessed verification property.112 is present (step S3503: YES), the process returns to step S3501. When an unprocessed verification property 112 is not present (step S3503: NO), a series of steps is finished.

According to eighth embodiment, coverage information is generated to judge which verification property 112 has been checked in a logic verification process. This prevents such useless work as redundant execution of logic verification, thereby shortening a verification period and avoiding omission in logic verification by clearly pointing out insufficiency of logic verification.

A ninth embodiment is an embodiment according to which a verification property 112 defined by a cause/result graph in the first to fourth embodiments is displayed in waveform to visually check whether the verification property 112 is a desired one.

Figure 37:
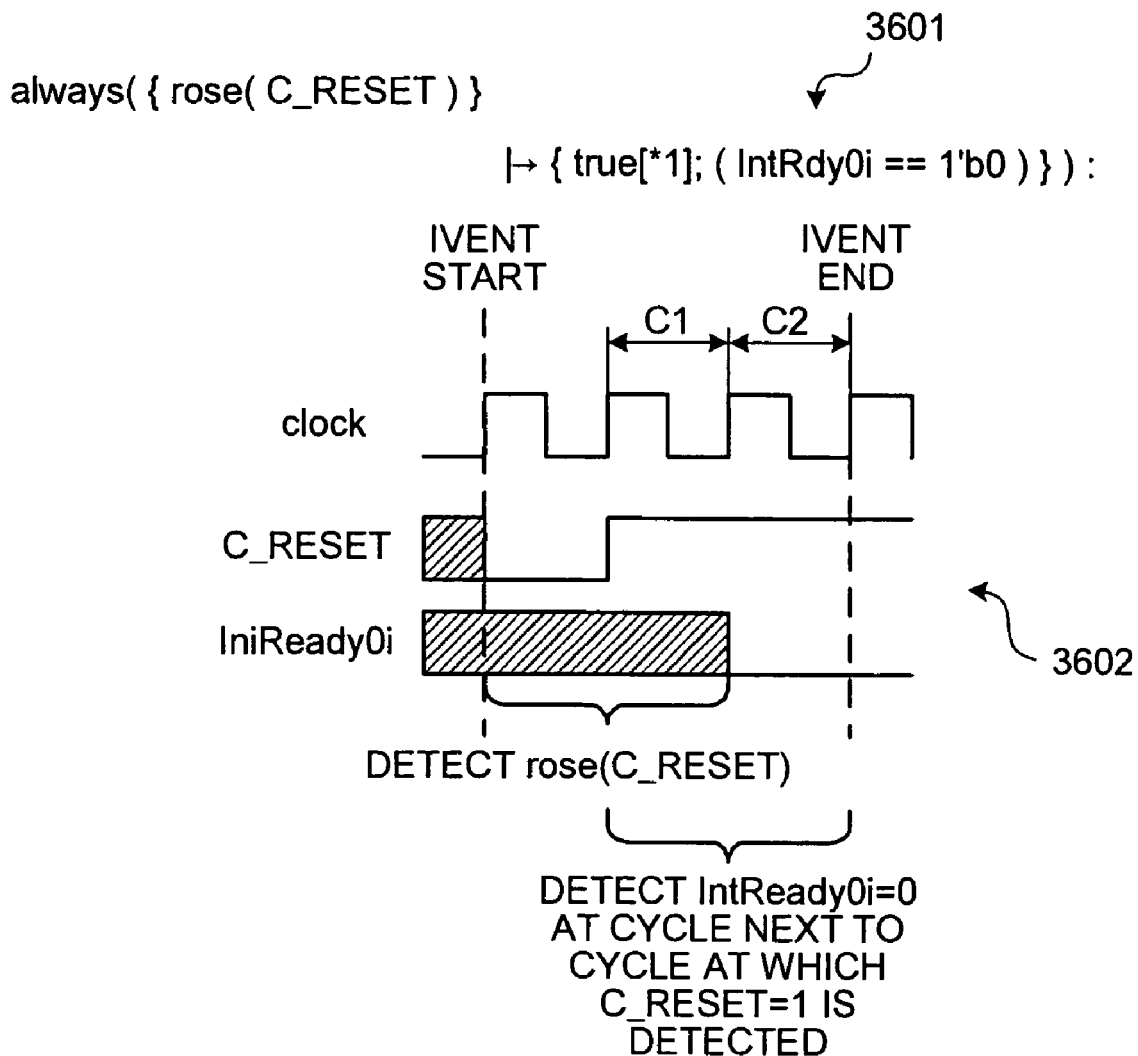
FIG. 37 is a schematic of a verification property displayed in waveform.

FIG. 37 is a schematic of a verification property displayed in waveform. A verification property 3601 indicates "If C_RESET rises, rewrite IntRdy0i into 0 at the next cycle".

A reference numeral 3602 denotes a displayed waveform representing the verification property 3601. The displayed waveform 3602 indicates that rising of C_RESET is detected at a cycle C1, and IntRdy0i=0 is detected at the next cycle C2. Thus, according to the ninth embodiment, the verification property 112 can be displayed visually in an easily recognizable form.

According to the above embodiments, various verification properties 112 can be automatically generated by sorting out the types of verification items and listing parameters to reduce the amount of description data and allowing a computer to read verification data. In addition to the generation of verification properties, support of generation of specification and inconsistency check is executed, thereby reducing a design turnaround time (TAT). The automatic generation of verification properties 112 allows a designer to easily carry out assertion-based verification even if the designer is not familiar with a verification property language such as PSL.

As described above, according to the method and apparatus for supporting verification and a computer product, a verification period and labor of a designer can be reduced The verification support method described in the embodiments of the present invention can be realized by executing a prepared program by a computer such as a personal computer, workstation, etc. The program is stored in a computer-readable recording medium, such as an HD, an FD, a CD-ROM, an MO, and a DVD, and is executed by being read from the recording medium by the computer. The program may be a transmittable medium that can be distributed via a network such as the Internet.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A verification support apparatus comprising:
   a receiving unit that receives description data including a description of a change in a state of a register included in a circuit and template specifying information, the description including a description of a cause and a description of a result of the change;
   a first extracting unit that extracts, from a group of templates, a template specified by the template specifying information; and
   a generating unit that generates a verification property representing the change, based on the template and the description of the change.

2. The verification support apparatus according to claim 1, further comprising a second extracting unit that extracts, from a group of verification properties generated by the generating unit, verification properties that conflict with one another, wherein the generating unit updates at least one of the extracted verification properties by adding the description of the cause of a verification property that has the highest priority among the extracted verification properties to the description of the cause of at least one of the extracted verification properties other than the verification property that has the highest priority.

3. The verification support apparatus according to claim 1, wherein the generating unit generates, based on the template and the description of the cause, a reverse proposition verification property indicating that the result is not obtained unless a condition that leads to the cause is satisfied.

4. The verification support apparatus according to claims 1, further comprising:
a display unit that includes a display screen; and
a display control unit that displays the verification property in waveform.

5. The verification support apparatus according to claim 1, further comprising a third-extracting unit that extracts data of an address and an operation of the register based on the description data, wherein
the generating unit generates specification data of the circuit based on the data extracted by the third-extracting unit.

6. The verification support apparatus according to claim 1, wherein
the description data further includes information on number of cycles from the cause to the result,
the generating unit generates, based on the description data, a graph expressing a relation between the cause and the result using nodes, edges, and the number of cycles, and
the verification support apparatus further comprising:
a searching unit that searches, among a group of graphs generated by the generating unit, a first graph and a second graph, the first graph having a result node corresponding to a result that is identical to a cause node corresponding to a cause in the second graph;
a connecting unit that connects the result node in the first graph to the cause node in the second graph to generate a third graph;
a detecting unit that detects consistency of the description data based on the third graph and a fourth graph that is not connected to any graph; and
an output unit that outputs a result of detection by the detecting unit.

7. The verification support apparatus according to claim 6, further comprising an adding unit that adds another result node in the first graph to the third graph, wherein
the detecting unit detects inconsistency of the description data by judging whether an exclusive relation is present between nodes that have same number of cycles in the third graph to which the other result node is added.

8. The verification support apparatus according to claim 6, further comprising a fourth-extracting unit that extracts a sub-graph from the third graph based on a logical sum node included in the third graph, wherein
the output unit further outputs the sub-graph as a verification scenario.

9. The verification support apparatus according to claim 1, further comprising:
a fifth extracting unit that extracts a verification property from a group of verification properties generated by the generating unit, wherein the generating unit generates coverage information indicating that logic verification using the verification property extracted by the fifth extracting unit has already been performed.

10. A verification support method comprising:
receiving, by a computer, description data including a description of a change in a state of a register included in a circuit and template specifying information, the description including a description of a cause and a description of a result of the change;
extracting by the computer, from a group of templates, a template specified by the template specifying information; and
generating, by the computer, a verification property representing the change, based on the template and the description of the change.

11. The verification support method according to claim 10, wherein the generating includes generating, based on the template and the description of the cause, a reverse proposition verification property indicating that the result is not obtained unless a condition that leads to the cause is satisfied.

12. The verification support method according to claim 10, further comprising extracting data of an address and an operation of the register based on the description data, wherein
the generating includes generating specification data of the circuit based on the data of an address and an operation.

13. The verification support method according to claim 10, wherein
the description data further includes information on number of cycles from the cause to the result,
the generating includes generating, based on the description data, a graph expressing a relation between the cause and the result using nodes, edges, and the number of cycles, and
the verification support method further comprising:
searching, among a group of graphs generated at the generating, a first graph and a second graph, the first graph having a result node corresponding to a result that is identical to a cause node corresponding to a cause in the second graph;
connecting the result node in the first graph to the cause node in the second graph to generate a third graph;
detecting consistency of the description data based on the third graph and a fourth graph that is not connected to any graph; and
outputting a result of detection at the detecting.

14. The verification support method according to claim 13, further comprising adding another result node in the first graph to the third graph, wherein
the detecting includes detecting inconsistency of the description data by judging whether an exclusive relation is present between nodes that have same number of cycles in the third graph to which the other result node is added.

15. The verification support method according to claim 13, further comprising extracting a sub-graph from the third graph based on a logical sum node included in the third graph, wherein
the outputting includes outputting the sub-graph as a verification scenario.

16. The verification support method according to claim 10, further comprising extracting a verification property from a group of verification properties generated at the generating, wherein
the generating includes generating coverage information indicating that logic verification using the verification property extracted has already been performed.

17. A computer-readable recording medium that stores therein a verification support program, the verification support program causes a computer to execute:

receiving description data including a description of a change in a state of a register included in a circuit and template specifying information, the description including a description of a cause and a description of a result of the change;

extracting, from a group of templates, a template specified by the template specifying information; and generating a verification property representing the change, based on the template and the description of the change.

18. The computer-readable recording medium according to claim 17, wherein the generating includes generating, based on the template and the description of the cause, a reverse proposition verification property indicating that the result is not obtained unless a condition that leads to the cause is satisfied.

19. The computer-readable recording medium according to claim 17, wherein the program further causes the computer to execute extracting data of an address and an operation of the register based on the description data, and the generating includes generating specification data of the circuit based on the data of an address and an operation.

20. The computer-readable recording medium according to claim 17, wherein the description data further includes information on number of cycles from the cause to the result, the generating includes generating, based on the description data, a graph expressing a relation between the cause and the result using nodes, edges, and the number of cycles, and the program further causes the computer to execute:

searching, among a group of graphs generated at the generating, a first graph and a second graph, the first graph having a result node corresponding to a result in the first graph is identical to a cause node corresponding to a cause in the second graph;

connecting the result node in the first graph to the cause node in the second graph to generate a third graph;

detecting consistency of the description data based on the third graph and a fourth graph that is not connected to any graph; and outputting a result of detection at the detecting.

21. The computer-readable recording medium according to claim 20, wherein the program further causes the computer to execute adding another result node in the first graph to the third graph, and the detecting includes detecting inconsistency of the description data by judging whether an exclusive relation is present between nodes that have same number of cycles in the third graph to which the other result node is added.

22. The computer-readable recording medium according to claim 20, wherein the program further causes the computer to execute extracting a sub-graph from the third graph based on a logical sum node included in the third graph, and the outputting unit includes outputting the sub-graph as a verification scenario.

23. The computer-readable recording medium according to claim 17, wherein the program further causes the computer to execute extracting a verification property from a group of verification properties generated at the generating, and the generating includes generating coverage information indicating that logic verification using the verification property extracted has been already performed.

* * * * *